(12) United States Patent
Park et al.

(10) Patent No.: US 11,734,484 B2
(45) Date of Patent: Aug. 22, 2023

(54) METHOD FOR AUTOMATING SEMICONDUCTOR DESIGN BASED ON ARTIFICIAL INTELLIGENCE

(71) Applicant: MakinaRocks Co., Ltd., Seoul (KR)

(72) Inventors: Jinwoo Park, Gyeonggi-do (KR); Wooshik Myung, Seoul (KR); Kyeongmin Woo, Seoul (KR); Jiyoon Lim, Seoul (KR)

(73) Assignee: MAKINAROCKS CO., LTD., Seoul (KR)

( * ) Notice: Subject to any disclaimer, the term of this patent is extended or adjusted under 35 U.S.C. 154(b) by 0 days.

(21) Appl. No.: 17/986,167

(22) Filed: Nov. 14, 2022

(65) Prior Publication Data

US 2023/0153506 A1     May 18, 2023

(30) Foreign Application Priority Data

Nov. 18, 2021 (KR) .................. 10-2021-0159381
Jul. 7, 2022 (KR) .................. 10-2022-0083785

(51) Int. Cl.
   *G06F 30/392*    (2020.01)
   *G06F 30/31*    (2020.01)
   *G06N 3/045*    (2023.01)
   *G06F 30/327*    (2020.01)
   *G06F 30/394*    (2020.01)

(52) U.S. Cl.
CPC ............ *G06F 30/392* (2020.01); *G06F 30/31* (2020.01); *G06F 30/327* (2020.01); *G06F 30/394* (2020.01); *G06N 3/045* (2023.01)

(58) Field of Classification Search
CPC ..................................................... G06F 30/392
USPC ........................................................ 716/119
See application file for complete search history.

(56) References Cited

U.S. PATENT DOCUMENTS

| | | |
|---|---|---|
| 5,926,396 A | 7/1999 | Ohara |
| 9,984,191 B2 | 5/2018 | Hsieh et al. |
| 10,552,566 B2 | 2/2020 | Park et al. |
| 10,896,278 B2 | 1/2021 | Hashimoto et al. |
| 2010/0306725 A1 | 12/2010 | Kawasaki |
| 2021/0334445 A1* | 10/2021 | Goldie .............. G06N 3/08 |

FOREIGN PATENT DOCUMENTS

| | | |
|---|---|---|
| JP | 2001051968 A | 2/2001 |
| JP | 2010277230 A | 12/2010 |
| JP | 2013149308 A | 8/2013 |
| JP | 2015167041 A | 9/2015 |
| JP | 2018077595 A | 5/2018 |
| KR | 100296183 B1 | 10/2001 |
| KR | 101730692 B1 | 4/2017 |
| KR | 1020180035526 A | 4/2018 |
| WO | 2018234945 A1 | 12/2018 |

* cited by examiner

*Primary Examiner* — Eric D Lee
(74) *Attorney, Agent, or Firm* — Umberg Zipser LLP

(57) ABSTRACT

Disclosed is a method for automating a semiconductor design based on artificial intelligence, which is performed by a computing device. The method may include: generating a first embedding for a semiconductor element to be placed in a canvas based on feature information and logical design information of the semiconductor element by using a first neural network; and generating a probability distribution for placing the semiconductor element based on the first embedding and a second embedding for semiconductor elements already placed in the canvas by using a second neural network.

14 Claims, 20 Drawing Sheets

| | 4/12 | |
|---|---|---|
| | | |
| | | |

62

| | 2/12 | |
|---|---|---|
| | | |
| | | |

Fig.13

| 61 | | | | 62 | | |
|---|---|---|---|---|---|---|
| | 4/12 | | | | 2/12 | |
| | 4/12 | | | | 4/12 | |
| | | | | | | |

Fig.14

| | 61 | |
|---|---|---|
| 3/12 | 4/12 | 1/12 |
| 2/12 | 4/12 | 2/12 |
| 1/12 | 4/12 | 3/12 |

| | 62 | |
|---|---|---|
| 3/12 | 2/12 | 1/12 |
| 4/12 | 4/12 | 4/12 |
| 1/12 | 2/12 | 3/12 |

| | | | | | | | |
|---|---|---|---|---|---|---|---|
| | | | | | | ① | |
| | | | | | 3/12 | 4/12 | 1/12 |— 61
| | | | | | 2/12 | 4/12 | 2/12 |
| | | | | | 1/12 | 4/12 | 3/12 |
| | | | | | | | 0 |— 71
| | | | | | | | 0 |
| | | | | | | | 0 |
| | | | | | | | ② |

82

| | | | | | | | |
|---|---|---|---|---|---|---|---|
| | | | | | | ① | |
| | | | | | 3/12 | 2/12 | 1/12 |— 62
| | | | | | 4/12 | 4/12 | 4/12 |
| | | | | | 1/12 | 2/12 | 9/12 |
| | | | | | | | 1 |— 72
| | | | | | | | 1 |
| | | | | | | | 6/12 |
| | | | | | | | ② |

METHOD FOR AUTOMATING SEMICONDUCTOR DESIGN BASED ON ARTIFICIAL INTELLIGENCE

CROSS-REFERENCE TO RELATED APPLICATIONS

This application claims priority to and the benefit of Korean Patent Application No. 10-2021-0159381 filed in the Korean Intellectual Property Office on Nov. 18, 2021, the entire contents of which are incorporated herein by reference.

TECHNICAL FIELD

The present disclosure relates to a semiconductor designing method, and more particularly, artificial intelligence technology for solving and optimizing a problem which occurs in a semiconductor designing process.

This study was carried out as part of the proliferation of private intelligent information services of the Ministry of Science and ICT and the Korea Information and Communications Agency (A0903-21-1021, Development of AI-based semiconductor design automation system).

BACKGROUND ART

Despite the development of technology, the logical design of the semiconductor, which can be regarded as an integration of the high-tech industry, is generally used by engineers directly by hand using tools for the placement of semiconductor element. Therefore, the logical design of the semiconductor is inevitably performed based on the experience of the engineer, and the design speed inevitably depends on the engineer's skill. In addition, it is very difficult for engineers to have an efficient arrangement in mind the connections of tens to millions of semiconductor element. In other words, since the current semiconductor design process is dependent on the experience and intuition of the engineer, it is difficult to maintain a consistent design quality, and the time and financial costs that must be invested for the design are quite necessary.

Korean Patent Registration No. 10-0296183 (Oct. 22, 2001) discloses a design method of a semiconductor integrated circuit.

SUMMARY OF THE INVENTION

The present disclosure has been made in an effort to provide a method for automating a logical design process of a semiconductor which depends on intuition of a person by using artificial intelligence.

An exemplary embodiment of the present disclosure provides a method performed by a computing device. The method may include: generating a first embedding for a semiconductor element to be placed in a canvas based on feature information and logical design information of the semiconductor element by using a first neural network; and generating a probability distribution for placing the semiconductor element based on the first embedding and a second embedding for semiconductor elements already placed in the canvas by using a second neural network.

Alternatively, the feature information may include size information including at least one of a width or a height of the semiconductor element, type information indicating whether the semiconductor element is the macro cell, and numerical information indicating the number of other elements connected to the semiconductor element.

Alternatively, the logical design information may include index information regarding a placement order of the semiconductor elements and the Netlist information indicating the connection between the semiconductor elements.

Alternatively, the method may further include converting the netlist information of the hypergraph structure into an ordinary graph structure expressing the connection of the semiconductor elements one to one.

Alternatively, the first neural network may include a graph neural network using a residual connection.

Alternatively, the generating of the probability distribution for placing the semiconductor element based on the first embedding and the second embedding for semiconductor elements already placed in the canvas may include combining the first embedding and the second embedding in a space based on a grid of the canvas by using the second neural network, and generating the probability distribution for placing the semiconductor element by adjusting a dimension of a third embedding generated by the combination through the second neural network.

Alternatively, the combining of the first embedding and the second embedding in the space based on the grid of the canvas may include generating a placement map indicating the placement state of the semiconductor elements already placed in the canvas by using the second neural network, and generating the third embedding by broadcasting the first embedding to the placement map through the second neural network.

Alternatively, the generating of the placement map indicating the placement state of the semiconductor elements already placed in the canvas may include generating the placement map by aggregating the second embedding to all areas of the grid through the second neural network.

Alternatively, the generating of the third embedding by broadcasting the first embedding to the placement map may include generating the third embedding by concatenating the first embedding to all second embeddings included in the placement map through the second neural network.

Alternatively, the generating of the probability distribution for placing the semiconductor element by adjusting the dimension of the third embedding generated by the combination may include generating the probability distribution for placing the semiconductor element by gradually reducing the dimension of the third embedding generated by the combination through the second neural network.

Alternatively, the first neural network and the second neural network may be pre-trained through the reinforcement learning based on a state including the feature information and the logical design information of the semiconductor element, an action of placing the semiconductor element in the canvas in an order by a larger size, and a reward for the action.

Alternatively, the reward may be computed by a weighted sum of a length of a wire connecting the semiconductor elements placed in the canvas through the action, and a congestion of the semiconductor elements placed in the canvas through the action.

Alternatively, the congestion may be computed as a ratio of a second routing resource indicating a required resource for connecting the semiconductor elements placed in the canvas by the wire to a first routing resource indicating a supplied resource in which the wire may be assigned for each area of the canvas.

Another exemplary embodiment of the present disclosure provides a computer program stored in a computer-readable storage medium. The computer program executes the following operations for automating a semiconductor design based on artificial intelligence when the computer program is executed by one or more processors and the operations may include: an operation of generating a first embedding for a semiconductor element to be placed in a canvas based on feature information and logical design information of the semiconductor element by using a first neural network; and an operation of generating a probability distribution for placing the semiconductor element based on the first embedding and a second embedding for semiconductor elements already placed in the canvas by using a second neural network.

Yet another exemplary embodiment of the present disclosure provides a computing device. The device may include: a processor including at least one core; a memory including program codes executable in the processor; and a network unit receiving feature information and logical design information of a semiconductor element, and the processor may be configured to generate a first embedding for a semiconductor element to be placed in a canvas based on the feature information and the logical design information by using a first neural network, and generate a probability distribution for placing the semiconductor element based on the first embedding and a second embedding for semiconductor elements already placed in the canvas by using a second neural network.

According to an exemplary embodiment of the present disclosure, a method for automating a semiconductor design can be provided, which can reduce the time and cost required for a logical design process of a semiconductor and enhance a design quality by reducing a design deviation which occurs by an engineer.

BRIEF DESCRIPTION OF THE DRAWINGS

Figure 13:
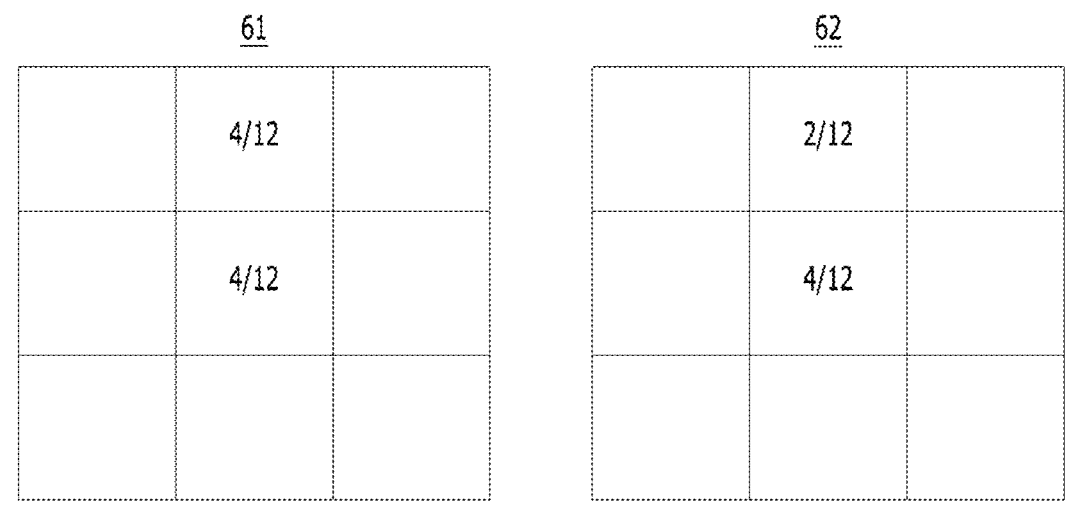

FIGS. 7 to 15 are conceptual views illustrating a process of estimating a reward for the action of the neural network model according to an exemplary embodiment of the present disclosure.

DETAILED DESCRIPTION

Figure 1:
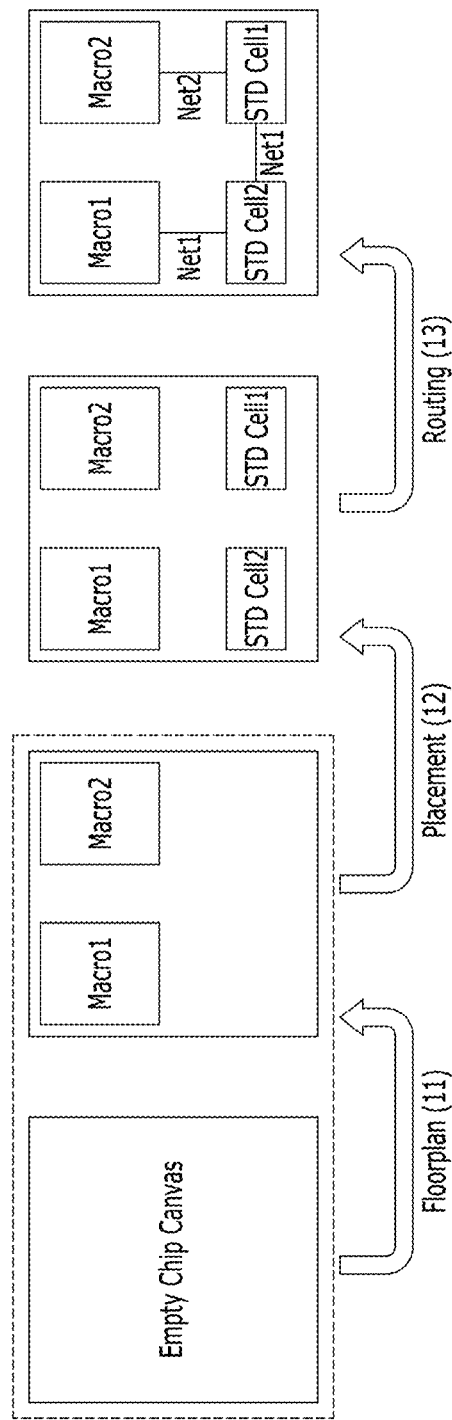
FIG. 1 is a conceptual view illustrating a basic semiconductor designing process.

Various exemplary embodiments will now be described with reference to drawings. In the present specification, various descriptions are presented to provide appreciation of the present disclosure. However, it is apparent that the exemplary embodiments can be executed without the specific description.

"Component", "module", "system", and the like which are terms used in the specification refer to a computer-related entity, hardware, firmware, software, and a combination of the software and the hardware, or execution of the software. For example, the component may be a processing procedure executed on a processor, the processor, an object, an execution thread, a program, and/or a computer, but is not limited thereto. For example, both an application executed in a computing device and the computing device may be the components. One or more components may reside within the processor and/or a thread of execution. One component may be localized in one computer. One component may be distributed between two or more computers. Further, the components may be executed by various computer-readable media having various data structures, which are stored therein. The components may perform communication through local and/or remote processing according to a signal (for example, data transmitted from another system through a network such as the Internet through data and/or a signal from one component that interacts with other components in a local system and a distribution system) having one or more data packets, for example.

The term "or" is intended to mean not exclusive "or" but inclusive "or". That is, when not separately specified or not clear in terms of a context, a sentence "X uses A or B" is intended to mean one of the natural inclusive substitutions. That is, the sentence "X uses A or B" may be applied to any of the case where X uses A, the case where X uses B, or the case where X uses both A and B. Further, it should be understood that the term "and/or" used in this specification designates and includes all available combinations of one or more items among enumerated related items.

It should be appreciated that the term "comprise" and/or "comprising" means presence of corresponding features and/or components. However, it should be appreciated that the term "comprises" and/or "comprising" means that presence or addition of one or more other features, components, and/or a group thereof is not excluded. Further, when not separately specified or it is not clear in terms of the context that a singular form is indicated, it should be construed that the singular form generally means "one or more" in this specification and the claims.

The term "at least one of A or B" should be interpreted to mean "a case including only A", "a case including only B", and "a case in which A and B are combined".

Those skilled in the art need to recognize that various illustrative logical blocks, configurations, modules, circuits, means, logic, and algorithm steps described in connection with the exemplary embodiments disclosed herein may be additionally implemented as electronic hardware, computer software, or combinations of both sides. To clearly illustrate the interchangeability of hardware and software, various illustrative components, blocks, configurations, means, logic, modules, circuits, and steps have been described above generally in terms of their functionalities. Whether the functionalities are implemented as the hardware or software depends on a specific application and design restrictions given to an entire system. Skilled artisans may implement the described functionalities in various ways for each particular application. However, such implementation decisions should not be interpreted as causing a departure from the scope of the present disclosure.

The description of the presented exemplary embodiments is provided so that those skilled in the art of the present disclosure use or implement the present disclosure. Various modifications to the exemplary embodiments will be apparent to those skilled in the art. Generic principles defined herein may be applied to other embodiments without departing from the scope of the present disclosure. Therefore, the present disclosure is not limited to the exemplary embodiments presented herein. The present disclosure should be analyzed within the widest range which is coherent with the principles and new features presented herein.

In the present disclosure, a network function and an artificial neural network and a neural network may be interchangeably used.

FIG. 1 is a conceptual view illustrating a basic semiconductor designing process. The design of the semiconductor requires Netlist information that defines the characteristics of semiconductor elements and the connection between the elements. In the Net list information, semiconductor elements are divided into relatively large macro cells and relatively small standard cells. The macro cell has no separate specifications about the size, and may be constituted by millions of transistors, which is usually characterized by a larger size than the standard cell. For example, the macro cell includes a SRAM or a CPU core. The standard cell refers to a small unit of element that has a basic function, which is constituted by one or more transistors. The standard cell provides a simple logical operation (e.g., AND, OR, and XOR) or a storage function such as a flipflop, and may provide a more complicated function such as a 2-bit full adder or a multi-D input flipflop. A specification for a size of the standard cell is determined unlike the macro cell.

The Netlist information may be regarded as a set of nets that indicate the connectivity of the semiconductor elements. The Netlist information generally represents properties and connections of hundreds of macro cells and hundreds of thousands to millions of standard cells as data of a hypergraph structure. Hypergraph is a graph in which one edge may express a connection for a plurality of nodes unlike an ordinary graph in which one edge represents the connection for two nodes.

Referring to FIG. 1, a process for designing the semiconductor may be divided into three steps. First a floorplan step 11 is performed in which the macro cell which is an element having a relatively large size is placed in an empty canvas. Next, a placement step 12 is performed in which the standard cell is placed in a remaining space of the canvas other than a space in which the macro cell is placed. Last, a routing step 13 is performed in which the macro cell and the standard cell placed in the canvas are physically connected through a wire.

Whether a good design is made through the process is evaluated through a metric called PPA. The PPA represents power, performance, and area. According to the PPA, the semiconductor design aims at providing a small area while showing low power consumption and high performance, i.e., low production price with high integrity. In order to optimize the PPA according to the aiming, the length of the wire connecting the semiconductor elements should be reduced. When the length of the wire connecting the elements is shortened, the reaching of an electrical signal may be quickened. In addition, when the reaching of the electrical signal is quickened, the performance of the semiconductor cannot but be raised. Further, the electrical signal is delivered within a short time to reduce the user of the power. Moreover, when the overall use of the wire decreases, the integrity increases, and an area occupied by the elements cannot but be smaller.

According to the above-described viewpoint, it may be considered that all elements are just disposed close to each other for the good design. However, since a routing resource representing the resource capable of assigning the wire is limited every canvas, it is realistically impossible to just placing all elements to be close to each other. For example, when there is yet another wire on a street corner through which the wire for connecting two elements pass, the wire for connecting two elements cannot but be placed via another canvas area by detouring another wire. In such a case, the length of the wire cannot but increase while the wire is detoured and placed, which cannot but influence the placement of the wire for connecting subsequent elements. That is, since a routing resource which is a resource capable of physically assigning the wire for each area of the canvas is limited, when the elements are placed without considering the routing resource, a design result cannot but be bad.

Therefore, for the good design, it is important to consider the overall connectivity including the standard cell from the floorplan step 11 of placing the macro cell having the relatively large size and a lot of connectivity. Currently, the floorplan step 11 is primarily performed manually by an engineer. For example, in the floorplan step 11, the macro cell is placed by the intuition of the engineer. There are many cases in which the engineer primarily places the macro cell at an edge of the canvas to leave a central space for the placement of the standard cell. When the macro cell is placed, the engineer places the standard cell by using a function provided by an existing rule based tool. That is, a current logical design process of the semiconductor is performed by significantly depending on an experience of the engineer. Such a scheme has a problem in that since it is realistically very difficult to place substantially dozens to millions of elements by considering the connection of the elements, a business performing speed or a quality of a result cannot but depend on proficiency of the engineer. Moreover, there is often a case where a time of several days are required for the design processes 12 and 13 after the floorplan step 11, and when the quality of a final design result is not good, the subsequent processes 12 and 13 should be performed again from the floorplan step 11. It may be significantly consumptive in terms of cost to repeat the cycle several times. Therefore, a method cannot but be required, which can perform quick and accurate design from a logical design step of the semiconductor and reduce a deviation of the design quality.

Hereinafter, the method of the present disclosure contrived based on the above-described problem will be described in detail with reference to FIGS. 2 to 21.

Figure 2:
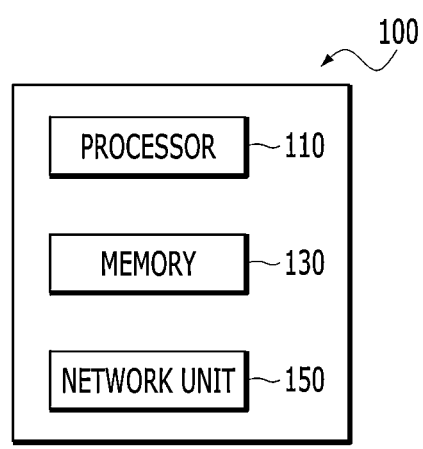
FIG. 2 is a block diagram of a computing device according to an exemplary embodiment of the present disclosure.

FIG. 2 is a block diagram of a computing device for automating a semiconductor design based on artificial intelligence according to an exemplary embodiment of the present disclosure.

A configuration of the computing device 100 illustrated in FIG. 2 is only an example shown through simplification. In an exemplary embodiment of the present disclosure, the computing device 100 may include other components for performing a computing environment of the computing device 100 and only some of the disclosed components may constitute the computing device 100.

The computing device 100 may include a processor 110, a memory 130, and a network unit 150.

The processor 110 may be constituted by one or more cores and may include processors for data analysis and deep learning, which include a central processing unit (CPU), a general purpose graphics processing unit (GPGPU), a tensor processing unit (TPU), and the like of the computing device. The processor 110 may read a computer program stored in the memory 130 to perform data processing for machine learning according to an exemplary embodiment of the present disclosure. According to an exemplary embodiment of the present disclosure, the processor 110 may perform a calculation for learning the neural network. The processor 110 may perform calculations for learning the neural network, which include processing of input data for learning in deep learning (DL), extracting a feature in the input data, calculating an error, updating a weight of the neural network using backpropagation, and the like. At least one of the CPU, GPGPU, and TPU of the processor 110 may process learning of a network function. For example, both the CPU and the GPGPU may process the learning of the network function and data classification using the network function. Further, in an exemplary embodiment of the present disclosure, processors of a plurality of computing devices may be used together to process the learning of the network function and the data classification using the network function. Further, the computer program executed in the computing device according to an exemplary embodiment of the present disclosure may be a CPU, GPGPU, or TPU executable program.

According to an exemplary embodiment of the present disclosure, the processor 110 may train a neural network model that performs a logical design of a semiconductor. For example, the processor 110 may train the neural network model so as to place the semiconductor elements in the canvas in an order by a larger size based on feature information and logical design information of the semiconductor element. The feature information may include size information including at least one of a width or a height of the semiconductor element, type information indicating whether the semiconductor element is the macro cell, and numerical information indicating the number of other elements connected to the semiconductor element. Further, the logical design information may include index information regarding a placement order of the semiconductor elements and the Netlist information indicating the connection between the semiconductor elements. That is, the neural network model may be trained so as to place the semiconductor element in the canvas by receiving the property of the semiconductor element itself and information on the connection of the semiconductor element. In this case, the neural network model may be trained so as to optimize the PPA by considering the lengths of the wires of the elements and the routing resource of each of the canvas and the elements.

The processor 110 may perform the logical design of the semiconductor by using the pre-trained neural network model as described above. For example, the processor 110 may place the semiconductor elements in the canvas in an order by a larger size based on the feature information and the logical design information of the semiconductor element by using the trained neural network model. The neural network model may place the semiconductor elements in the canvas so that all of the semiconductor elements are connected, and the density and the congestion of the semiconductor elements on the canvas are maximally evenly distributed. Such a placement process corresponds to a floorplan corresponding to the logical design of the semiconductor. That is, the processor 110 may effectively improve problems in terms of cost and quality which the existing floorplan scheme has through the trained neural network model.

According to an exemplary embodiment of the present disclosure, the memory 130 may include at least one type of storage medium of a flash memory type storage medium, a hard disk type storage medium, a multimedia card micro type storage medium, a card type memory (for example, an SD or XD memory, or the like), a random access memory (RAM), a static random access memory (SRAM), a read-only memory (ROM), an electrically erasable programmable read-only memory (EEPROM), a programmable read-only memory (PROM), a magnetic memory, a magnetic disk, and an optical disk. The computing device 100 may operate in connection with a web storage performing a storing function of the memory 130 on the Internet. The description of the memory is just an example and the present disclosure is not limited thereto.

The network unit 150 according to an exemplary embodiment of the present disclosure may use an arbitrary type known wired/wireless communication systems. The network unit 150 may receive information for semiconductor design from an external system. For example, the network unit 150 may receive feature information and logical design information of the semiconductor device from a semiconductor-related database. In this case, the feature information and the logical design information received from the database may be data for learning or data for inference of a neural network model. Feature information and logical design information of the semiconductor device may include information of the above-described examples, but are not limited to the above-described examples and may be variously configured within a range that may be understood by those skilled in the art.

In addition, the network unit 150 may transmit and receive information processed by the processor 110 and a user interface through communication with other terminals. For example, the network unit 150 may provide the user interface generated by the processor 110 to the client (e.g. user terminal). In addition, the network unit 150 may receive an external input of a user applied as a client and transmit the received input to the processor 110. In this case, the processor 110 may process operations such as output, correction, change, and addition of information provided through the user interface based on the user's external input received from the network unit 150.

Meanwhile, the computing device 100 according to an embodiment of the present invention may include a server as a computing system for transmitting and receiving information through communication with a client. In this case, the client may be a terminal of any type capable of accessing the server. For example, the computing device (100), which is a server, may receive information for semiconductor design from an external database to generate logical design results and provide a user interface for logical design results to a user terminal. In this case, the user terminal may output a user interface received from the computing device 100, which is a server, and may receive or process information through interaction with the user.

In a further embodiment, computing device 100 may include any type of terminal that receives data resources generated by any server and performs additional information processing.

Figure 3:
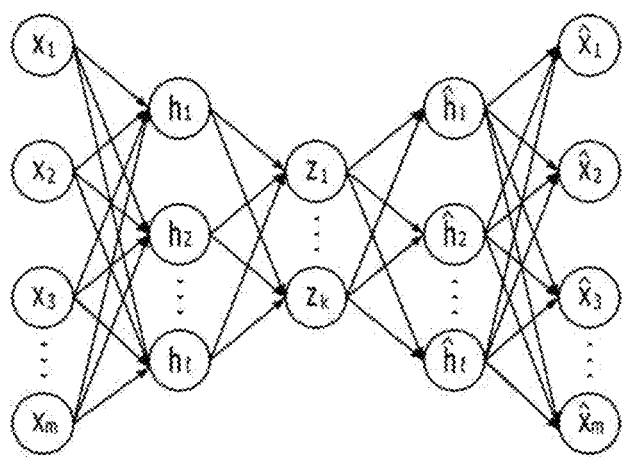
FIG. 3 is a conceptual view illustrating a neural network according to an exemplary embodiment of the present disclosure.

FIG. 3 is a schematic diagram illustrating a network function according to an exemplary embodiment of the present disclosure.

The neural network model according to an embodiment of the present disclosure may include a neural network for logical design of a semiconductor. The neural network may be generally constituted by an aggregate of calculation units which are mutually connected to each other, which may be called nodes. The nodes may also be called neurons. The neural network is configured to include one or more nodes. The nodes (alternatively, neurons) constituting the neural networks may be connected to each other by one or more links.

In the neural network, one or more nodes connected through the link may relatively form the relationship between an input node and an output node. Concepts of the input node and the output node are relative and a predetermined node which has the output node relationship with respect to one node may have the input node relationship in the relationship with another node and vice versa. As described above, the relationship of the input node to the output node may be generated based on the link. One or more output nodes may be connected to one input node through the link and vice versa.

In the relationship of the input node and the output node connected through one link, a value of data of the output node may be determined based on data input in the input node. Here, a link connecting the input node and the output node to each other may have a weight. The weight may be variable and the weight is variable by a user or an algorithm in order for the neural network to perform a desired function. For example, when one or more input nodes are mutually connected to one output node by the respective links, the output node may determine an output node value based on values input in the input nodes connected with the output node and the weights set in the links corresponding to the respective input nodes.

As described above, in the neural network, one or more nodes are connected to each other through one or more links to form a relationship of the input node and output node in the neural network. A characteristic of the neural network may be determined according to the number of nodes, the number of links, correlations between the nodes and the links, and values of the weights granted to the respective links in the neural network. For example, when the same number of nodes and links exist and there are two neural networks in which the weight values of the links are different from each other, it may be recognized that two neural networks are different from each other.

The neural network may be constituted by a set of one or more nodes. A subset of the nodes constituting the neural network may constitute a layer. Some of the nodes constituting the neural network may constitute one layer based on the distances from the initial input node. For example, a set of nodes of which distance from the initial input node is n may constitute n layers. The distance from the initial input node may be defined by the minimum number of links which should be passed through for reaching the corresponding node from the initial input node. However, a definition of the layer is predetermined for description and the order of the layer in the neural network may be defined by a method different from the aforementioned method. For example, the layers of the nodes may be defined by the distance from a final output node.

The initial input node may mean one or more nodes in which data is directly input without passing through the links in the relationships with other nodes among the nodes in the neural network. Alternatively, in the neural network, in the relationship between the nodes based on the link, the initial input node may mean nodes which do not have other input nodes connected through the links. Similarly thereto, the final output node may mean one or more nodes which do not have the output node in the relationship with other nodes among the nodes in the neural network. Further, a hidden node may mean nodes constituting the neural network other than the initial input node and the final output node.

In the neural network according to an exemplary embodiment of the present disclosure, the number of nodes of the input layer may be the same as the number of nodes of the output layer, and the neural network may be a neural network of a type in which the number of nodes decreases and then, increases again from the input layer to the hidden layer. Further, in the neural network according to another exemplary embodiment of the present disclosure, the number of nodes of the input layer may be smaller than the number of nodes of the output layer, and the neural network may be a neural network of a type in which the number of nodes decreases from the input layer to the hidden layer. Further, in the neural network according to yet another exemplary embodiment of the present disclosure, the number of nodes of the input layer may be larger than the number of nodes of the output layer, and the neural network may be a neural network of a type in which the number of nodes increases from the input layer to the hidden layer. The neural network according to still yet another exemplary embodiment of the present disclosure may be a neural network of a type in which the neural networks are combined.

A deep neural network (DNN) may refer to a neural network that includes a plurality of hidden layers in addition to the input and output layers. When the deep neural network is used, the latent structures of data may be determined. That is, latent structures of photos, text, video, voice, and music (e.g., what objects are in the photo, what the content and feelings of the text are, what the content and feelings of the voice are) may be determined. The deep neural network may include a convolutional neural network (CNN), a recurrent neural network (RNN), an auto encoder, generative adversarial networks (GAN), a restricted Boltzmann machine (RBM), a deep belief network (DBN), a Q network, a U network, a Siam network, a Generative Adversarial Network (GAN), and the like. The description of the deep neural network described above is just an example and the present disclosure is not limited thereto.

In an exemplary embodiment of the present disclosure, the network function may include the auto encoder. The auto encoder may be a kind of artificial neural network for outputting output data similar to input data. The auto encoder may include at least one hidden layer and odd hidden layers may be disposed between the input and output layers. The number of nodes in each layer may be reduced from the number of nodes in the input layer to an intermediate layer called a bottleneck layer (encoding), and then expanded symmetrical to reduction to the output layer (symmetrical to the input layer) in the bottleneck layer. The auto encoder may perform non-linear dimensional reduction. The number of input and output layers may correspond to a dimension after preprocessing the input data. The auto encoder structure may have a structure in which the number of nodes in the hidden layer included in the encoder decreases as a distance from the input layer increases. When the number of nodes in the bottleneck layer (a layer having a smallest number of nodes positioned between an encoder and a decoder) is too small, a sufficient amount of information may not be delivered, and as a result, the number of nodes in the bottleneck layer may be maintained to be a specific number or more (e.g., half of the input layers or more).

The neural network may be learned in at least one scheme of supervised learning, unsupervised learning, semi supervised learning, or reinforcement learning. The learning of the neural network may be a process in which the neural network applies knowledge for performing a specific operation to the neural network.

The neural network may be learned in a direction to minimize errors of an output. The learning of the neural network is a process of repeatedly inputting learning data into the neural network and calculating the output of the neural network for the learning data and the error of a target and back-propagating the errors of the neural network from the output layer of the neural network toward the input layer in a direction to reduce the errors to update the weight of each node of the neural network. In the case of the supervised learning, the learning data labeled with a correct answer is used for each learning data (i.e., the labeled learning data) and in the case of the unsupervised learning, the correct answer may not be labeled in each learning data. That is, for example, the learning data in the case of the supervised learning related to the data classification may be data in which category is labeled in each learning data. The labeled learning data is input to the neural network, and the error may be calculated by comparing the output (category) of the neural network with the label of the learning data. As another example, in the case of the unsupervised learning related to the data classification, the learning data as the input is compared with the output of the neural network to calculate the error. The calculated error is back-propagated in a reverse direction (i.e., a direction from the output layer toward the input layer) in the neural network and connection weights of respective nodes of each layer of the neural network may be updated according to the back propagation. A variation amount of the updated connection weight of each node may be determined according to a learning rate. Calculation of the neural network for the input data and the backpropagation of the error may constitute a learning cycle (epoch). The learning rate may be applied differently according to the number of repetition times of the learning cycle of the neural network. For example, in an initial stage of the learning of the neural network, the neural network ensures a certain level of performance quickly by using a high learning rate, thereby increasing efficiency and uses a low learning rate in a latter stage of the learning, thereby increasing accuracy.

In learning of the neural network, the learning data may be generally a subset of actual data (i.e., data to be processed using the learned neural network), and as a result, there may be a learning cycle in which errors for the learning data decrease, but the errors for the actual data increase. Overfitting is a phenomenon in which the errors for the actual data increase due to excessive learning of the learning data. For example, a phenomenon in which the neural network that learns a cat by showing a yellow cat sees a cat other than the yellow cat and does not recognize the corresponding cat as the cat may be a kind of overfitting. The overfitting may act as a cause which increases the error of the machine learning algorithm. Various optimization methods may be used in order to prevent the overfitting. In order to prevent the overfitting, a method such as increasing the learning data, regularization, dropout of omitting a part of the node of the network in the process of learning, utilization of a batch normalization layer, etc., may be applied.

FIGS. 4 to 15 are conceptual views for describing a reinforcement learning process of the neural network model according to an exemplary embodiment of the present disclosure.

Figure 4:
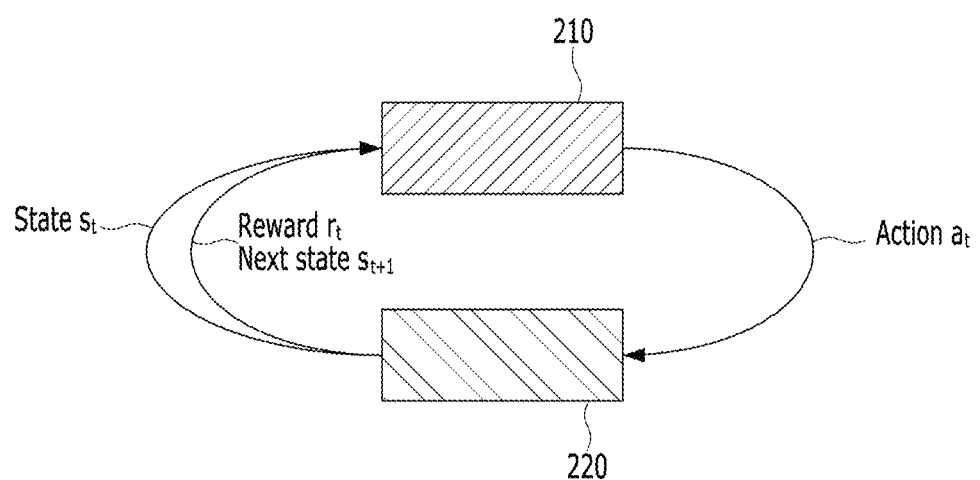
FIG. 4 is a conceptual view illustrating a reinforcement learning process.
Figure 5:
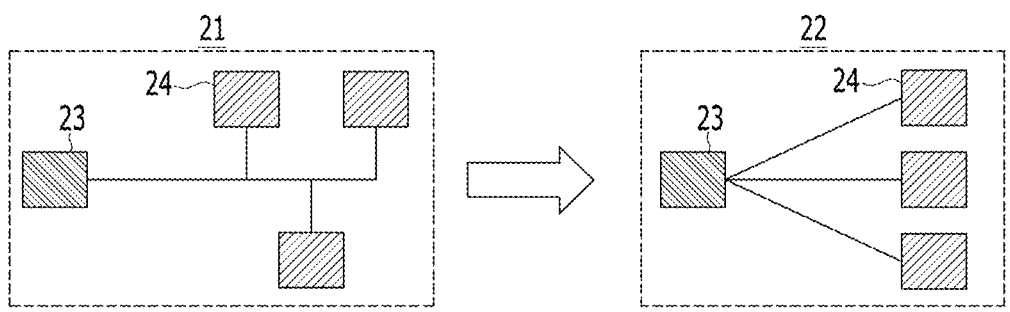
FIG. 5 is a conceptual view illustrating a preprocessing process for a state of a neural network model according to an exemplary embodiment of the present disclosure.

Reinforcement learning is a learning method that trains the neural network model based on a reward calculated for an action selected by the neural network model so as for the neural network model to determine a better action based on a state. The state as a set of values indicating how is a situation is at a current time may be appreciated as an input of the neural network model. The action which refers to determination according to an option which may be taken by the neural network model may be appreciated as an output of the neural network model. The reward refers to a gain followed when the neural network model performs a predetermined action, and represents an immediate value evaluated for a current state and a current action. The reinforcement learning may be appreciated as learning through trial and error in that the reward is given for the determination (i.e., action). A reward given to the neural network model in the process of the reinforcement learning may be a reward acquired by accumulating results of various actions. By considering the reward according to various states and actions through the reinforcement learning, the neural network model may be generated, which makes a return such as the reward itself or a total sum of the rewards be maximum. In the present disclosure, the neural network model may be interchangeably used with a term agent which is a main agent that determines which action to do according to a surrounding state. Referring to FIG. 4, there is an environment 220 to which the agent 210 belongs in the reinforcement learning. The environment 220 may be appreciated as meaning setting itself for the reinforcement learning of the agent 210. When the agent 210 does the action, the state may be changed through the environment 220, and the agent 210 may also receive the reward. The aim of the reinforcement learning trains the agent 210 so as to receive the reward as maximum as possible in the given environment 220.

According to an exemplary embodiment of the present disclosure, the processor 110 may train the neural network model through the reinforcement learning based on the state including the feature information and the logical design information of the semiconductor element, the action of placing the semiconductor element in the canvas, and the reward for the action. The processor 110 allows the neural network model to perform the action of placing one semiconductor element per cycle in the canvas and allows the neural network model to perform an action according to a next cycle by returning the reward according to the action jointly with the state to perform the reinforcement learning for the neural network model. For example, the processor 110 may perform an action at a specific time t of placing the semiconductor element in the canvas based on a state at the specific time t through the neural network model. The processor 110 may estimate a reward of a next time t+1 for the action for the specific time t and return the estimated reward to the neural network model. The processor 110 may perform the action at the next time t+1 by inputting the state and the reward at the next time t+1 into the neural network model. The processor 110 may perform the reinforcement learning for the neural network model so as to optimize the PPA which is an evaluation index of the logical design of the semiconductor by repeating such a cycle. According to an exemplary embodiment of the present disclosure, a state to be input as the input of the neural network model may include feature information indicating a feature of the semiconductor element itself. For example, the feature information may include size information including the width, the height, etc., of the semiconductor element. The feature information may include type information indicating whether the semiconductor element is the macro cell. Since the neural network model places the semiconductor elements in the canvas in the order by the larger size, the neural network model may be trained so as to place the semiconductor elements in the canvas in the order of the standard cell in the macro cell through the type information. The feature information may include numerical information indicating the number of other elements connected to the semiconductor element. The feature information of the example may be appreciated as information for allowing the neural network model to identify a semiconductor element to be placed at a specific time.

According to an exemplary embodiment of the present disclosure, the state to be input as the input of the neural network model may include the logical design information regarding the placement between the semiconductor elements. For example, the logical design information may include index information regarding the placement order of the semiconductor element. The neural network model may place the semiconductor elements in the canvas in the order by the larger size through the index information. The logical design information may include Netlist information indicating the connection between the semiconductor elements. In this case, the Netlist information may be data of the hypergraph structure. Since the data of the hypergraph structure is many-to-many relationship of expression type data, the data itself has a significantly complicated structure to analyze the data. Therefore, the processor 110 may preprocess the Netlist information of the hypergraph structure to be effectively processed by the neural network model.

Specifically, the processor 110 may convert the Netlist information of the hypergraph structure into an ordinary graph structure that expresses the connection between the semiconductor elements one to one. For example, referring to FIG. 5, the processor 110 may convert Netlist information having a hypergraph structure 21 into Netlist information having a ordinary graph structure 22. The hypergraph structure 21 corresponds to a many-to-many structure in which both a drive cell 23 corresponding to an input element and a load cell 24 corresponding to an output element are connected to one edge. On the contrary, the ordinary graph structure 22 corresponds to a structure in which the drive cell 23 and the load cell 24 have a one-to-one relationship so as to become a state in which two elements are connected to one edge. That is, the processor 110 may convert the Netlist information of the hypergraph structure 21 into the ordinary graph structure 22 so that the drive cell 23 and the load cell 24 have the one-to-one relationship. The processor 110 may perform the reinforcement learning by inputting the state including the Netlist information of the ordinary graph structure 22 generated through the conversion into the neural network model.

According to an exemplary embodiment of the present disclosure, the processor 110 may perform the action of placing the semiconductor element in the canvas by inputting the state including the feature information and the logical design information into the neural network model. In this case, the action of placing the semiconductor element in the canvas may include an action of placing a mask in the canvas and placing the semiconductor element in one area in the canvas area in which the mask is not placed. For example, when performing the action of placing the semiconductor element based on the state including the feature information and the logical design information of the semiconductor element, the processor 110 may apply the mask to a canvas space divided into N*N (N is a natural number) grids. The mask may include a first mask corresponding to an area in which the semiconductor element may be deviated from the canvas and a second mask corresponding to an area overlapped with the semiconductor element already placed in the canvas. When the mask is applied to the canvas, the processor 110 may perform an action of placing the semiconductor element in the remaining area of the canvas to which the mask is not applied through the neural network model.

Figure 6:
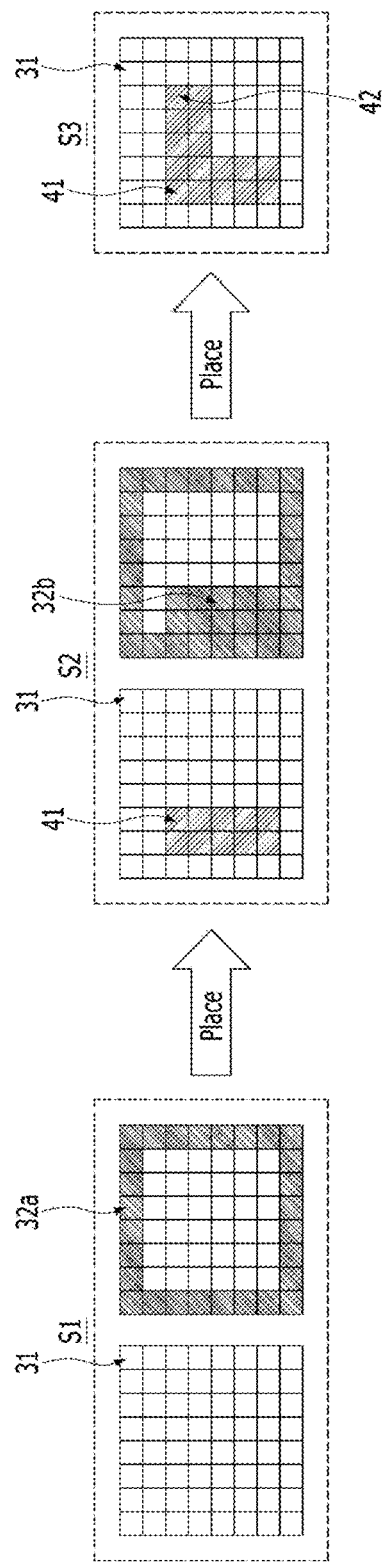
FIG. 6 is a conceptual view illustrating a process of performing an action of a neural network model according to an exemplary embodiment of the present disclosure.

Specifically, referring to FIG. 6, when a first element 41 is placed in the canvas 31, the neural network model of the processor 110 may apply a first mask 32a representing an area in which the first element 41 may be deviated from the canvas on the canvas 31 (S1). When the first mask 32a is applied, the neural network model of the processor 110 may perform an action of placing the first element 41 in an area other than the first mask 32a based on the state including the feature information and the logical design information of the semiconductor element. When the reward according to the placement of the first element 41 is returned and a second element 42 is placed in the canvas 31, the neural network model of the processor 110 may apply both the first mask 32a representing the area in which the second element 42 may be deviated from the canvas and a second mask 32b corresponding to an area which is overlapped with the first element 41 placed in the canvas onto the canvas 31 (S2). When the first mask 32a and the second mask 32b are applied, the neural network model of the processor 110 may perform an action of placing the second element 42 in an area other than an area where the masks 32a and 32b are present based on the state including the feature information and the logical design information of the semiconductor element. The neural network model may perform an efficient and accurate action by considering the physical environment of the canvas through the application of the mask.

According to an exemplary embodiment of the present disclosure, the processor 110 may estimate the reward based on the action of the neural network model based on the state including the feature information and the logical design information. In this case, the reward may include the length of the wire connecting the semiconductor elements placed in the canvas through the action, and a congestion of the semiconductor elements placed in the canvas through the action. For example, the reward may be computed by a weighted sum of the length of the wire and the congestion. The reward computed by the weighted sum of the length of the wire and the congestion may be expressed as in [Equation 1] as below.

$$R_{p,g} = \alpha W_{(p,g)} - \beta C_{(p,g)} \qquad \text{[Equation 1]}$$

Here, p represents the placement and g represents the graph. In addition, $R_{p,g}$ represents the reward, $\alpha$ and $\beta$ represents coefficients for adjusting an entire scale, W(p,g) represents the length of the wire, and C(p,g) represents the congestion. As in [Equation 1], the reward of the present disclosure may be derived through the weighed sum of flexibly adjusting the length of the wire and the size of the congestion through the coefficients.

According to an exemplary embodiment of the present disclosure, the length of the wire may be computed by a half of a circumference of an area in which the elements having the connection are placed. For example, when it is assumed that there is one net (i.e., elements of which placement is completed in a predetermined area of the canvas) of which placement is completed in one rectangular area, a half of the circumference of the rectangular area including the corresponding net may be estimated as the length of the wire. The processor 110 may perform the above-described computation for all nets, and then estimate the total sum as the length of the wire.

According to an exemplary embodiment of the present disclosure, the congestion may be computed as a ratio of a second routing resource indicating a required resource for connecting the semiconductor elements placed in the canvas by the wire to a first routing resource indicating a supplied resource in which the wire may be assigned for each area of the canvas. For example, the congestion may be expressed as in [Equation 2] as below.

$$C(v)=\text{demand}(v)/\text{supply}(v) \quad \text{[Equation 2]}$$

Here, v represents a grid cell which is a basic unit of the canvas area. In addition, C(v) represents the congestion, supply(v) represents the first routing resource provided by the grid cell of the canvas, and demand(v) represents the second routing resource required for connecting the semiconductor elements by the wire. According to [Equation 2], since the congestion is in proportion to the second routing resource, it may be expected that the second routing resource is reduced to lower the overall congestion.

The computation process of estimating the congestion will be described below in more detail with reference to FIGS. 7 to 15.

Figure 7:
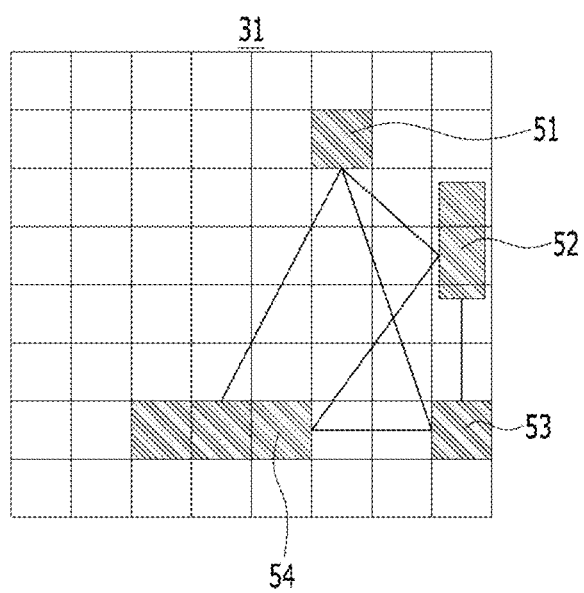
Figure 8:
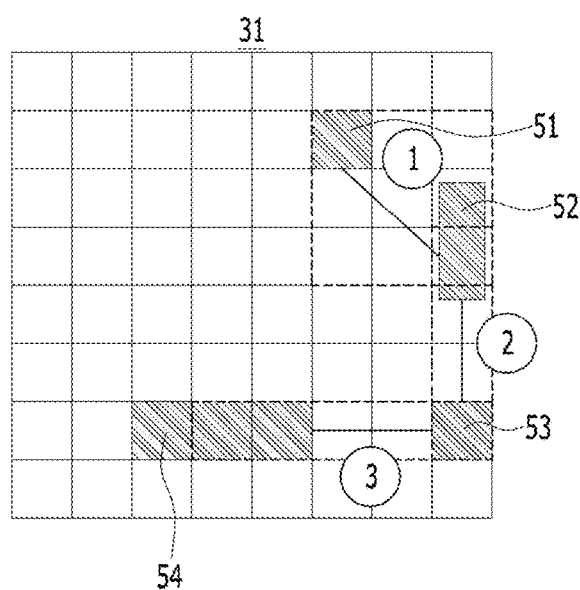

The processor 110 according to an exemplary embodiment of the present disclosure may generate a complete graph indicating a state in which all of the semiconductor elements placed in the canvas are connected to each other through the action. The processor 110 may convert the complete graph into a minimum spanning tree. The processor 110 converts the connection of the complete graph into the minimum spanning tree to express all elements to be directly and indirectly connected with a minimum edge number. When the PPA is considered, since a final routing result corresponding to the physical design of the semiconductor elements follows a form of the substantially minimum spanning tree, the processor 110 may estimate the congestion by converting the complete graph into the minimum spanning tree. For example, when the number of semiconductor elements 51, 52, 53, and 54 placed in the canvas 31 through the action is 4, the processor 110 may generate the complete graph in which four semiconductor elements 51, 52, 53, and 54 are all connected as illustrated in FIG. 7. The processor 110 may convert the complete graph into the minimum spanning tree as illustrated in FIG. 8. Here, the minimum spanning tree may be appreciated as a graph which allows the number of edges and the length to be minimized while connecting all of four semiconductor elements 51, 52, 53, and 54.

The processor 110 may compute the routing resource for each of the edges constituting the minimum spanning tree. Here, the routing resource may be appreciated as the resource required for connecting elements of which connection is defined to the edges. Specifically, the processor 110 may compute the number of cases for connecting the semiconductor elements by the wire in the canvas by considering the placement of the semiconductor elements corresponding to the node of the edge. The processor 110 may calculate an expectation value for a form in which the wire is to be placed in the canvas for each grid cell by considering each number of cases. In this case, the expectation value for the form in which the wire is to be placed in the canvas may include a first expectation value in which the wire is to be vertically placed in the grid cell of the canvas and a second expectation value in which the wire is to be horizontally placed in the grid cell of the canvas. The processor 110 may compute the routing resource for each of the edges based on the computed number of cases and the calculated expectation value.

For example, referring to FIG. 8, the processor 110 may segment the area of the grid cell required for calculating the routing resource of each of three edges constituting the minimum spanning tree into area ①, area ②, and area ③. The processor 110 may calculate the routing resource for each of three edges based on each area. That is, the processor 110 may calculate the routing resource required for connecting elements of which connection is defined to the edge with respect to each of area ①, area ②, and area ③.

Figure 9:
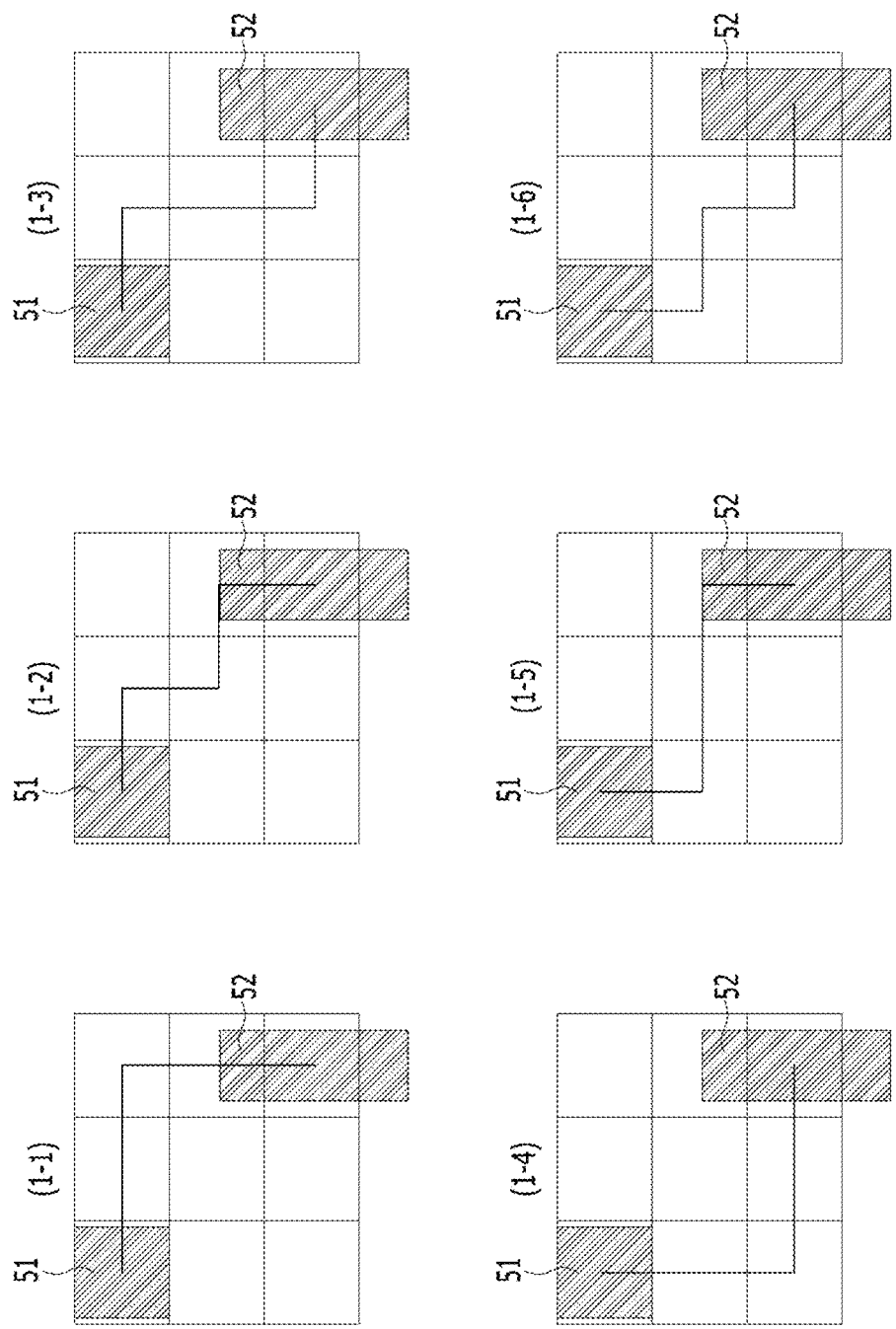
Figure 10:
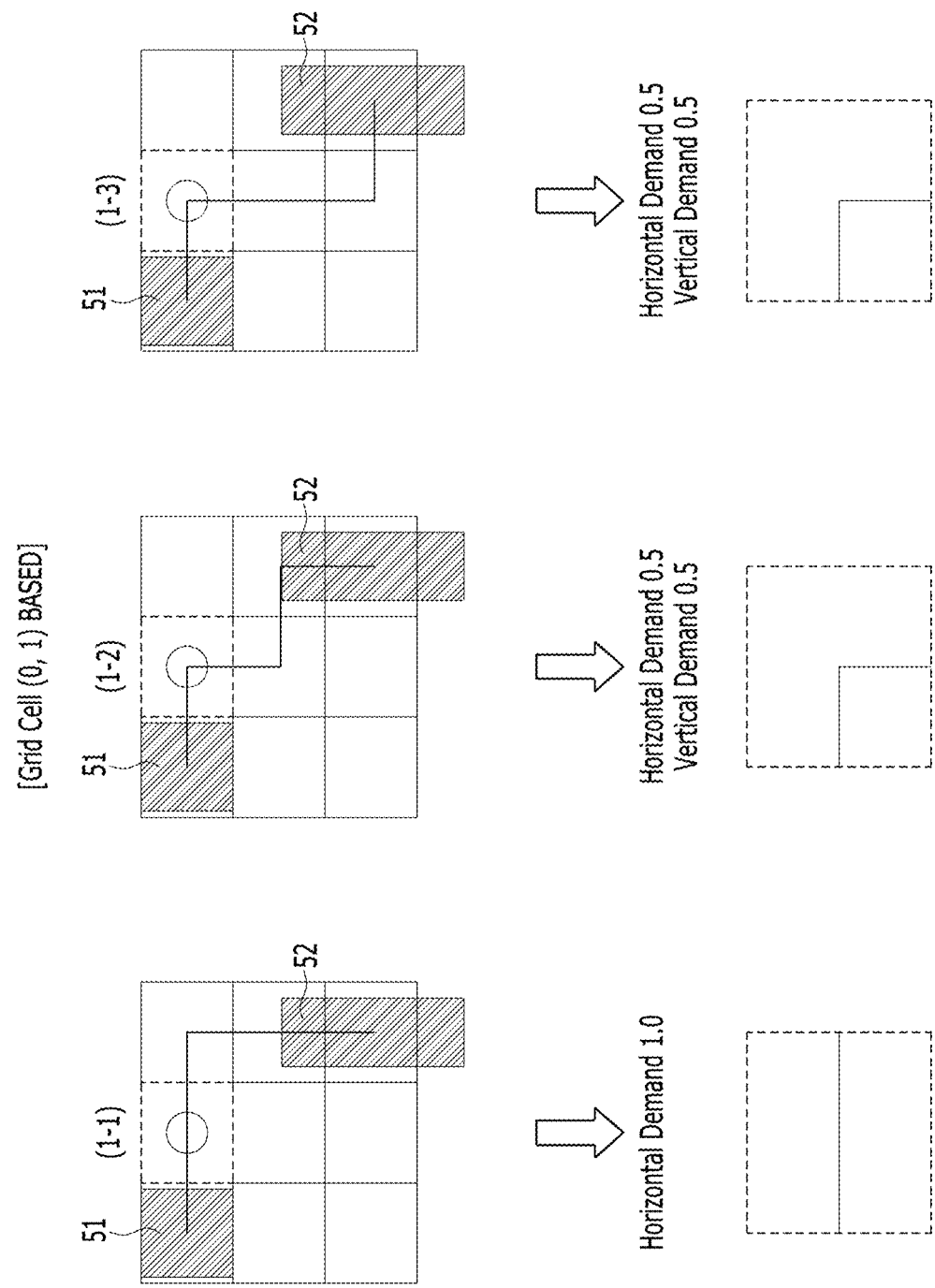
Figure 11:
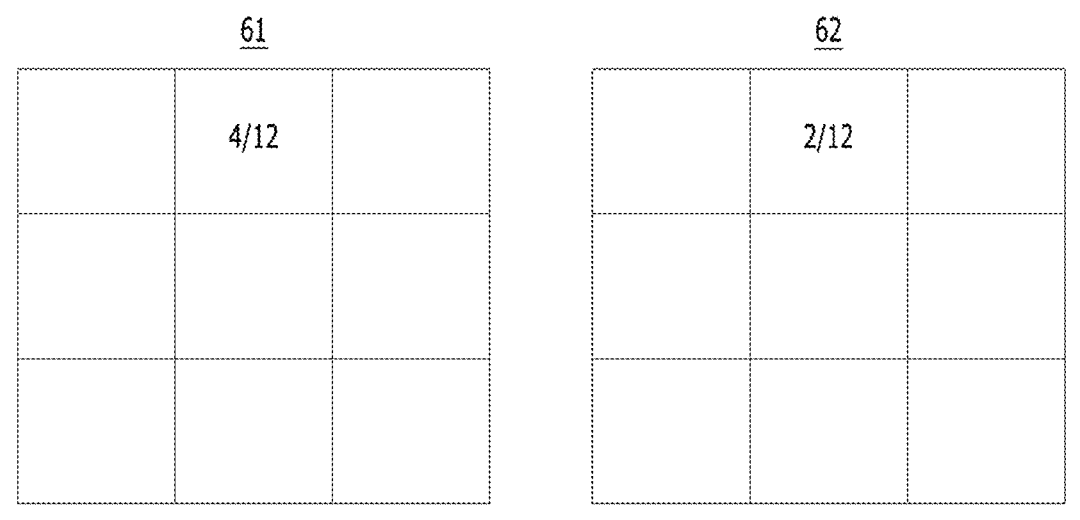
Figure 12:
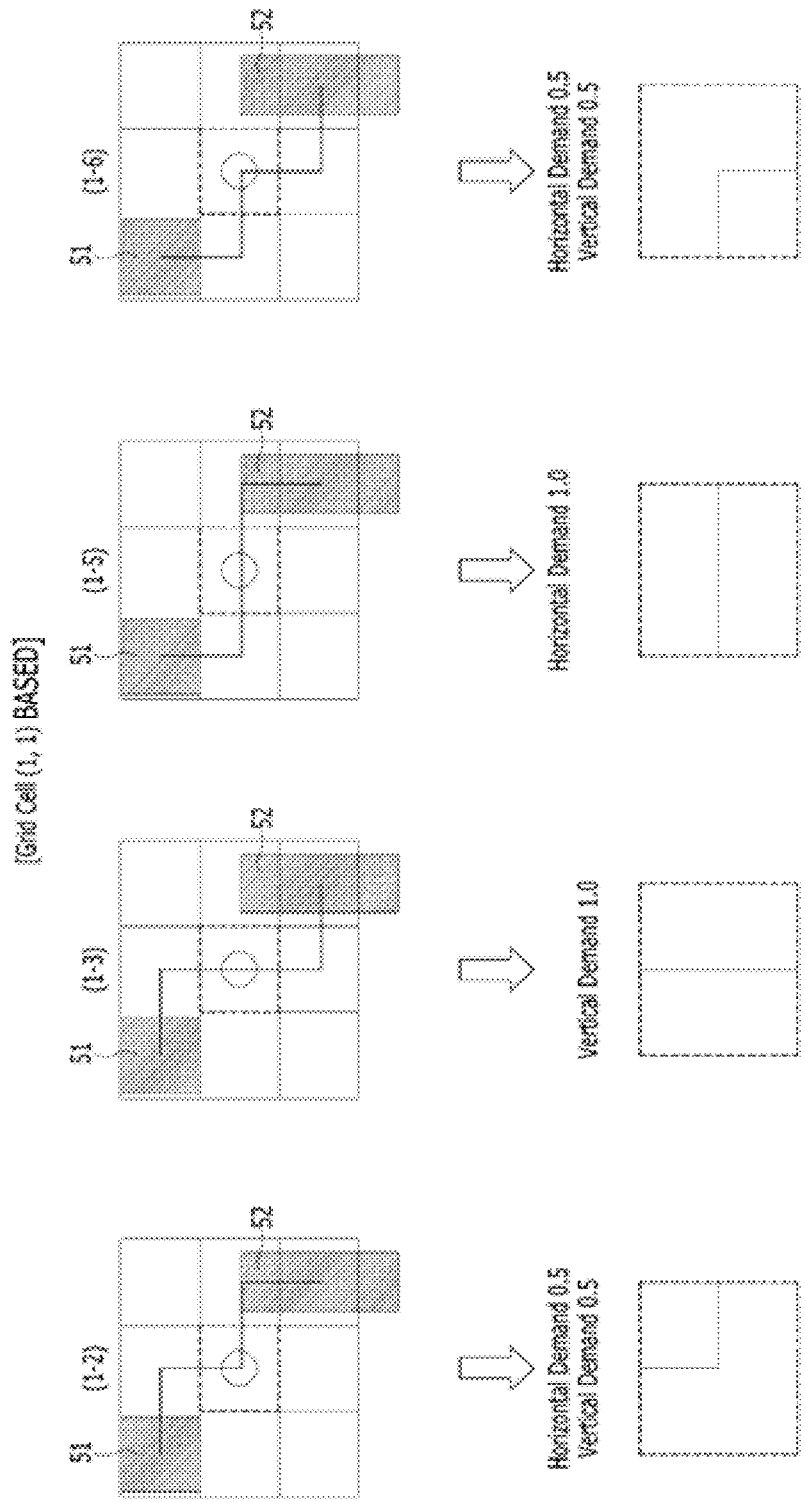

Referring to area ①, the number of cases in which two elements 51 and 52 which are present in area ① may be connected by the wire may be present as six types (1-1) to (1-6) as illustrated in FIG. 9. That is, the processor 110 may calculate the number of cases for physically connecting the elements as six types based on area ①. In addition, the processor 110 may calculate an expectation value for a form in which the wire is to be individually placed in the canvas for grid cells constituting area ①. Referring to FIG. 10, in the case of a grid cell (0, 1), the number of cases for connecting two elements 51 and 52 may correspond to (1-1), (1-2), and (1-3). Therefore, with respect to the grid cell (0, 1), the processor 110 may calculate the first expectation value which is the expectation value in which the wire is to be vertically placed and the second expectation value which is the expectation value in which the wire is to be horizontally placed by considering the number of three cases: (1-1), (1-2), and (1-3). The processor 110 may calculate first expectation value and second expectation value results of computing and adding a multiplication of a probability to select each number of three cases and the routing resource for the form in which the wire is to be placed in the grid cell (0, 1) according to the number of three cases, respectively. In this case, the probability to select each number of three cases is 1/6 which is a probability that one of six paths for connecting two elements 51 and 52 will be arbitrarily selected based on area ①. Therefore, the first expectation value may be calculated as $(1/6*1.0)+(1/6*0.5)+(1/6*0.5)=4/12$. Further, the second expectation value may be calculated as $(0)+(1/6*0.5)+(1/6*0.5)=2/12$. The processor 110 may store the first expectation value and the second expectation value calculated based on the grid cell (0, 1) at locations of (0, 1) of a first expectation value map 61 and a second expectation value map 62 for area ① illustrated in FIG. 11, respectively.

Referring to FIG. 10, in the case of a grid cell (1, 1), the number of cases for connecting two elements 51 and 52 may correspond to (1-2), (1-3), (1-5), and (1-6). Therefore, with respect to the grid cell (1, 1), the processor 110 may calculate the first expectation value which is the expectation value in which the wire is to be vertically placed and the second expectation value which is the expectation value in which the wire is to be horizontally placed by considering the number of four cases: (1-2), (1-3), (1-5), and (1-6). The processor 110 may calculate first expectation value and second expectation value results of computing and adding a multiplication of a probability to select each number of four cases and the routing resource for the form in which the wire is to be placed in the grid cell (1, 1) according to the number of three cases respectively. In this case, the probability to select each number of four cases is 1/6 which is a probability that one of six paths for connecting two elements 51 and 52 will be arbitrarily selected based on area ①. Therefore, the first expectation value may be calculated as (1/6*0.5)+(0)+(1/6*1.0)+(1/6*0.5)=4/12. Further, the second expectation value may be calculated as (1/6*0.5)+(1/6*1.0)+(0)+(1/6*0.5)=4/12. The processor 110 may store the first expectation value and the second expectation value calculated based on the grid cell (1, 1) at locations of (1, 1) of a first expectation value map 61 and a second expectation value map 62 for area ① illustrated in FIG. 13, respectively.

The processor 110 performs the computation such as the example for all grid cells of area ① to store respective expectation values for all areas of the first expectation value map 61 and the second expectation value map 62 as in FIG. 14. Further, the processor 110 performs the computation such as the example for areas ② and ③ in addition to area ① to generate the first expectation value map and the second expectation value map for all of three areas where the edge is present. In this case, the first expectation value map and the second expectation value map of each area may correspond to the routing resources of the respective edges.

The processor 110 may cumulatively sum the routing resources for the respective edges, and estimate the congestion based on a result value derived through the cumulative sum. Specifically, the processor 110 may estimate a second routing resource by averaging values of upper N % (N is a natural number) among the result values derived through the cumulative sum. The processor 110 may calculate a ratio of the first routing resource by using the estimated second routing resource, and estimate the congestion. The processor 110 reflects values of upper N % for cumulative sum of the edge routing resources to estimating the congestion to prevent the second routing resource which is very high from being shown in a specific area of the canvas. That is, the processor 110 evenly distributes the second routing resources in the entire canvas area to appropriately reflect the congestion for the entire canvas area to the reward.

For example, referring to FIG. 15, the processor 110 may reflect the first expectation value map and the second expectation value map generated for all of three areas in which the edge is present to global maps 81 and 82 representing the entire canvas area. In the process of reflecting each expectation value map, the processor 110 may perform the cumulative summing for an area in which each expectation value map is overlapped. That is, expectation values of a grind cell (3, 7) in which the expectation value maps 61 and 62 of area ① and the expectation value maps 71 and 72 of area ② are overlapped may be summed and stored as ³⁄₁₂ and ⁹⁄₁₂, respectively in the global maps 81 and 82. The processor 110 may update the global maps 81 and 82 for all edge areas, and utilize a value of 10% which is the highest as an estimation value of the congestion in a total average.

Figure 16:
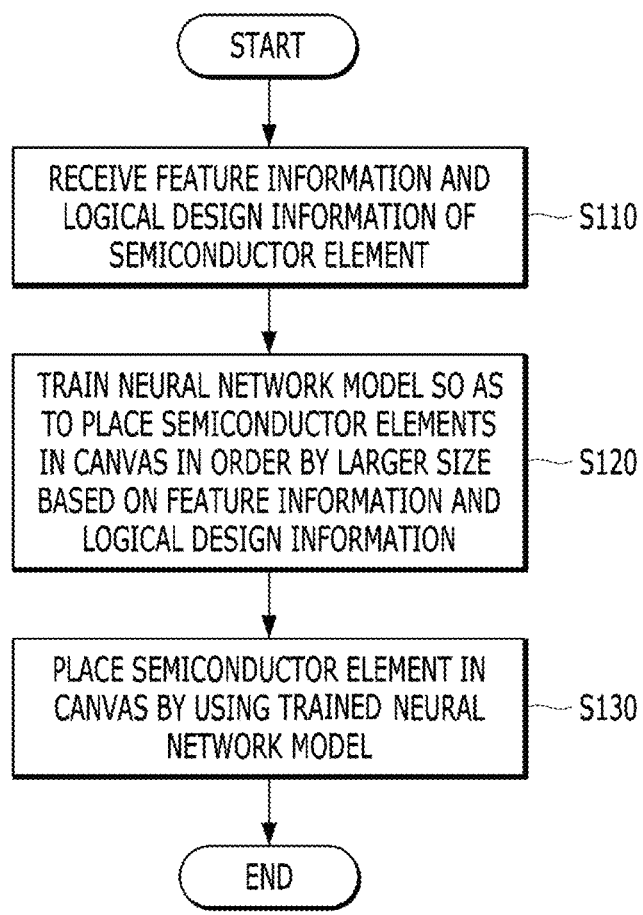
FIG. 16 is a flowchart illustrating a method for automating a semiconductor design based on artificial intelligence according to an exemplary embodiment of the present disclosure.

FIG. 16 is a flowchart illustrating a method for automating a semiconductor design based on artificial intelligence according to an exemplary embodiment of the present disclosure.

Referring to FIG. 16, a computing device 100 according to an exemplary embodiment of the present disclosure may receive feature information and logical design information of a semiconductor element from an external system (S110). The external system may be a server, a database, etc., which stores and manages the information for a logical design of a semiconductor. The computing device 100 may use the information received from the external system as input data for training a neural network model for the logical design of the semiconductor element. The computing device 100 may also use the information received from the external system as input data for operating (inferring) the neural network model for the logical design of the semiconductor element. A user aspect of the information may depend on according to a purpose such as training or operating (inferring) the neural network model.

The computing device 100 may train the neural network model so as to place the semiconductor elements in the canvas in an order by a larger size based on the feature information and the logical design information (S120). In this case, the training of the neural network model may be performed based on reinforcement learning. For example, the computing device 100 performs an action of placing semiconductor elements in a canvas in an order by a larger size by inputting the feature information and the logical design information into the neural network model, and returns a reward according to the action to the neural network model perform the reinforcement learning for the neural network model.

The computing device 100 may place the semiconductor elements in the canvas in an order by a larger size based on the feature information and the logical design information by using the neural network model trained through step S120 (S130). The computing device 100 may effectively place the semiconductor elements in the canvas according to a size order through the neural network model trained through the reinforcement learning. The computing device 100 may optimize PPA by using the neural network model trained through the reinforcement learning, and reduce deviations of design cost and a design quality in an existing design scheme.

Figure 17:
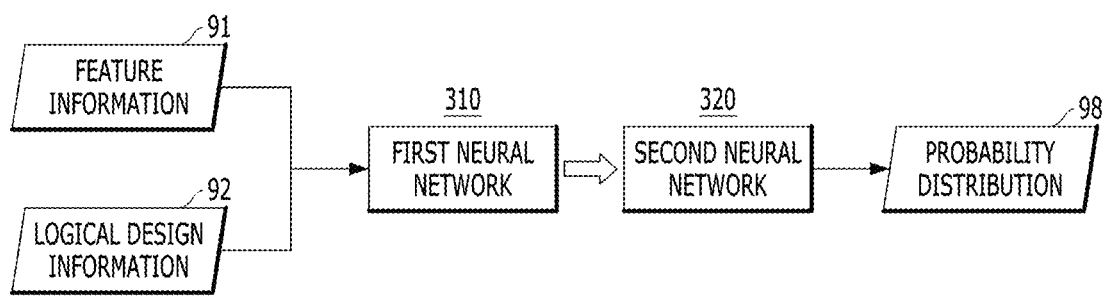
FIG. 17 is a block diagram illustrating an operation process of the neural network model according to an exemplary embodiment of the present disclosure.

FIG. 17 is a block diagram illustrating an operation process of the neural network model according to an exemplary embodiment of the present disclosure.

Referring to FIG. 17, the neural network model according to an exemplary embodiment of the present disclosure may include a first neural network 310 that generate first embedding for the semiconductor element to be placed in the canvas based on feature information 91 and logical design information 92 of the semiconductor element, and a second neural network 320 that generates a probability distribution 98 for placing the semiconductor element based on the first embedding and second embedding for semiconductor elements already placed in the canvas.

For example, the first neural network 310 may include a graph neural network using a residual connection. The first neural network 310 including the graph neural network using the residual connection may output node embedding for the semiconductor element by receiving the feature information 91 and the logical design information 92. In this case, the node embedding corresponding to the semiconductor element to be placed in the canvas may be distinguished as the first embedding and the node embedding for the semiconductor elements already placed in the canvas through the computation of the neural network model may be distinguished as the second embedding. The first neural network 310 may suppress over-smoothing even in a deep structure through the graph neural network using the residual connection, and show good performance in an appropriately deep structure as compared with a general graph neural network. The second neural network 320 may output the probability distribution 98 representing where the element to be placed in the canvas is to be placed based on the first embedding for the element to be placed in the canvas and the second embedding for the semiconductor elements already placed through the existing computation. The second neural network 320 may directly express spatial (or coordinate) information for the placement of the semiconductor on a 2D canvas space without separately receiving the spatial information as an input value of the first neural network 310 by utilizing both the first embedding and the second embedding for the computation. Therefore, input data for learning need not be changed each time according to a learning cycle and has a fixed value to expect that efficient learning is made.

Figure 18:
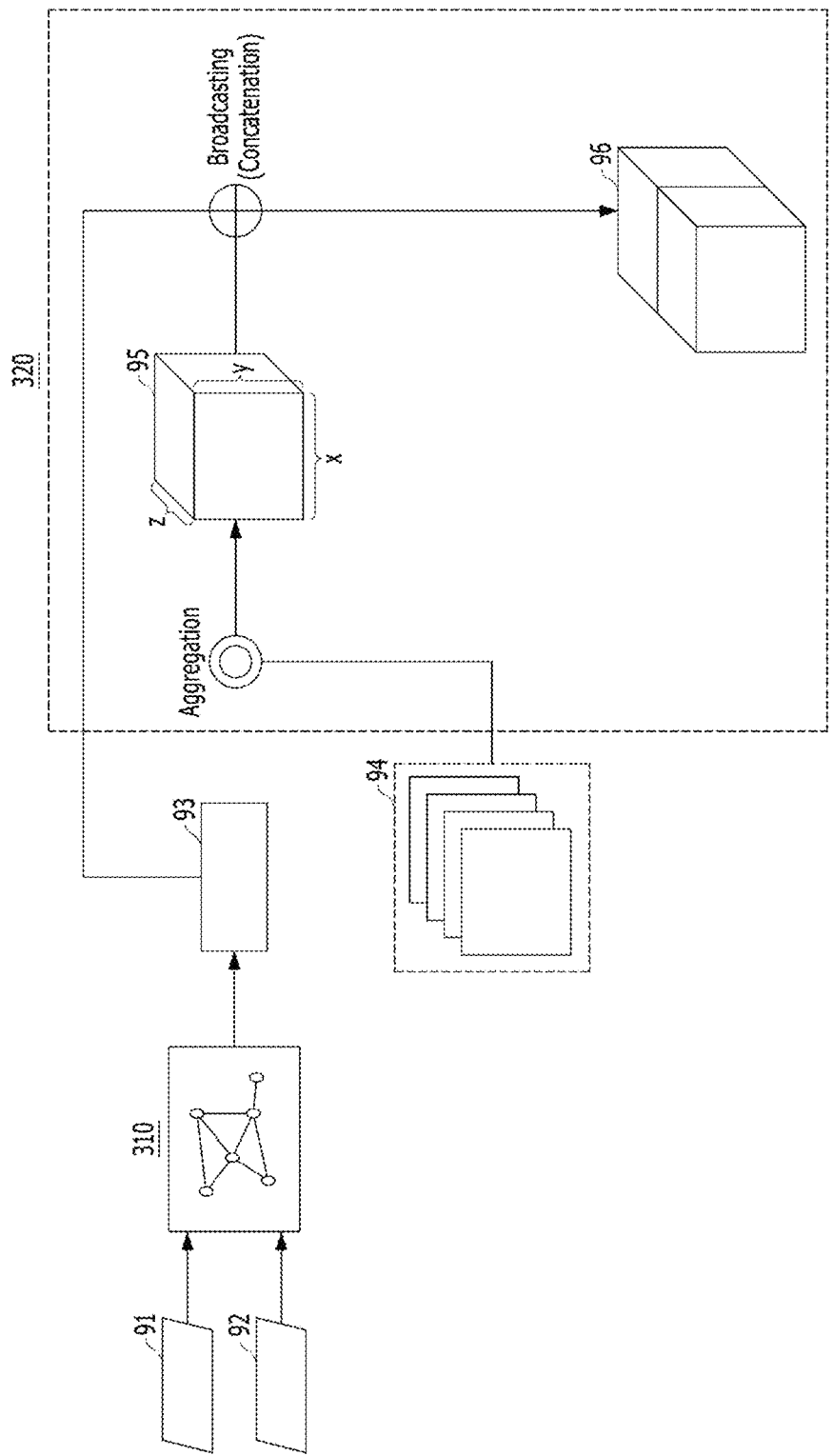
FIGS. 18 and 19 are block diagrams illustrating a structure of the neural network model according to an exemplary embodiment of the present disclosure.
Figure 19:
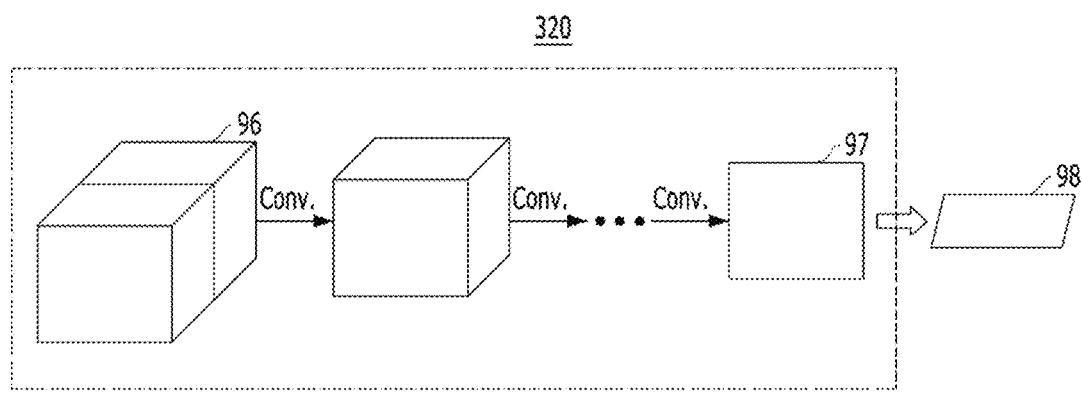

Meanwhile, according to an exemplary embodiment of the present disclosure, the first neural network and the second neural network may be pre-trained through the reinforcement learning based on the state including the feature information and the logical design information of the semiconductor element, the action of placing the semiconductor elements in the canvas in the order by the larger size, and the reward for the action. In this case, the reward may be computed through the weighted sum of the length of the wire connecting the semiconductor elements placed in the canvas through the action, and the congestion of the semiconductor elements placed in the canvas through the action. Further, the congestion may be computed as a ratio of a second routing resource indicating a required resource for connecting the semiconductor elements placed in the canvas by the wire to a first routing resource indicating a supplied resource in which the wire may be assigned for each area of the canvas. The contents of FIGS. 4 to 15 may be similarly applied to contents regarding the reinforcement learning applied to the first neural network and the second neural network. FIGS. 18 and 19 are block diagrams illustrating a structure of the neural network model according to an exemplary embodiment of the present disclosure.

Referring to FIG. 18, the first neural network 310 according to an exemplary embodiment of the present disclosure may generate the first embedding 93 for the semiconductor element by receiving the feature information 91 and the logical design information 92. In this case, the feature information may include size information including at least one of a width or a height of the semiconductor element, type information indicating whether the semiconductor element is the macro cell, and numerical information indicating the number of other elements connected to the semiconductor element. Further, the logical design information may include index information regarding a placement order of the semiconductor elements and the Netlist information indicating the connection between the semiconductor elements. Moreover, since the first neural network 310 includes the graph neural network using the residual connection, the first embedding 93 may be node embedding for the semiconductor element to be currently placed in the canvas.

The second neural network 320 according to an exemplary embodiment of the present disclosure may generate the probability distribution for placing the semiconductor element to be placed in the canvas based on the first embedding 93 and the second embedding 94 for the semiconductor elements already placed in the canvas. Specifically, the second neural network 320 may combine the first embedding 93 and the second embedding 94 in a space based on the grid of the canvas. The second neural network 320 may generate the probability distribution for placing the semiconductor element by adjusting a dimension of third embedding 96 generated through the combination.

For example, the second neural network 320 may generate a placement map 95 representing the placement state of the semiconductor elements already placed in the canvas.

The second neural network 320 aggregates the second embedding 94 for all areas of the grid to generate the placement map 95. In this case, the placement map 95 as embedding representing the current placement state of the semiconductor elements may be expressed as the number X of grid cells based on a row of the canvas, the number Y of grid cells based on a column of the canvas, and the number Z of semiconductor elements placed in the canvas. When elements #1, #2, and #4 among a total of Z elements are placed in the grid cell (0, 0), indexes #1, #2, and #4 have a value of 1 and the remaining indexes have a value of 0 with respect to a size of a vector of the number Z of semiconductor elements positioned at a location (0, 0) of the placement map. Through the information, the second neural network 320 aggregates the second embeddings 94 of elements #1, #2, and #4 to locate the second embedding 94 at (0, 0). When the second neural network 320 performs the computation for all locations of the grid cell, the second neural network 320 may obtain the placement map 95 having a size of X*Y*Z.

The second neural network 320 broadcasts the first embedding 93 in the placement map 95 to generate the third embedding 96. The second neural network 320 concatenates the first embedding 93 to all second embeddings 94 included in the placement map 95 to generate the third embedding 96. The second neural network 320 concatenates the first embedding 93 of the element to be currently placed in the canvas to all locations of the placement map 95 to generate the third embedding 96 having a size of X*Y*(2*Z).

Referring to FIG. 19, the second neural network 320 may output a probability distribution 98 for determining the location at which the element to be currently placed in the canvas is to be placed by reducing the dimension of the third embedding 96. The second neural network 320 may gradually reduce a channel of the third embedding 96 having the size of X*Y*(2*Z), and finally generate the third embedding 97 having the size of X*Y. In this case, the second neural network 320 may include a convolution neural network for gradually reducing the channel (or dimension) of the third embedding 96. A receptive field of the second neural network 320 gradually becomes larger by reducing the channel (or dimension) of the third embedding 96, and the second neural network 320 may be finally induced so as to utilize information of an entire area. The second neural network 320 may generate the probability distribution 98 for the action (or determination) of placing the semiconductor element in the canvas based on the third embedding 97 of which channel (or dimension) is reduced.

Figure 20:
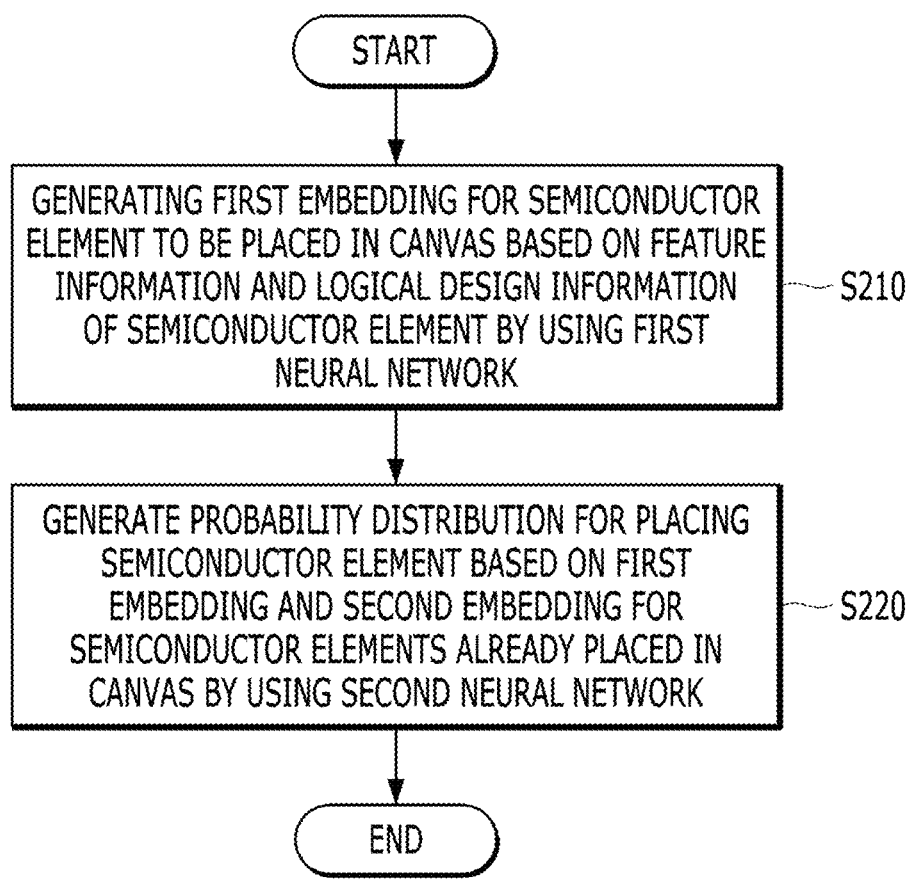
FIG. 20 is a flowchart illustrating a method for automating a semiconductor design based on artificial intelligence according to an additional exemplary embodiment of the present disclosure.

FIG. 20 is a flowchart illustrating a method for automating a semiconductor design based on artificial intelligence according to an additional exemplary embodiment of the present disclosure.

Referring to FIG. 20, a computing device 100 according to an exemplary embodiment of the present disclosure may generate a first embedding for a semiconductor element to be placed in a canvas based on feature information and logical design information of a semiconductor element by using a first neural network (S210). In this case, the feature information may include size information including at least one of a width or a height of the semiconductor element, type information indicating whether the semiconductor element is the macro cell, and numerical information indicating the number of other elements connected to the semiconductor element. Further, the logical design information may include index information regarding a placement order of the semiconductor elements and the Netlist information indicating the connection between the semiconductor elements.

Meanwhile, in step S210, the computing device 100 may perform preprocessing for the netlist information among the logical design information input into the first neural network. Specifically, the computing device 100 may perform preprocessing of converting the Netlist information of the hypergraph structure into an ordinary graph structure that expresses the connection between the semiconductor elements one to one. Through the preprocessing, the netlist information may be transformed to a form suitable for an input of the first neural network.

The computing device 100 may generate a probability distribution for placing the semiconductor element based on a first embedding and a second embedding for semiconductor elements already placed in the canvas by using a second neural network (S220). The computing device 100 may combine the first embedding and the second embedding in a space based on a grid of the canvas by using the second neural network. In this case, the combination may be appreciated as a computation process of generating a placement map by aggregating the second embedding and a computation process of concatenating the first embedding to all areas of the placement map. The computing device 100 may generate the probability distribution for placing the semiconductor element by adjusting a dimension of the third embedding generated by the combination through the second neural network. In this case, the dimension adjustment may be appreciated as a computation process of gradually reducing the dimension of the third embedding to a 2D form.

Disclosed is a computer readable medium storing the data structure according to an exemplary embodiment of the present disclosure.

The data structure may refer to the organization, management, and storage of data that enables efficient access to and modification of data. The data structure may refer to the organization of data for solving a specific problem (e.g., data search, data storage, data modification in the shortest time). The data structures may be defined as physical or logical relationships between data elements, designed to support specific data processing functions. The logical relationship between data elements may include a connection between data elements that the user defines. The physical relationship between data elements may include an actual relationship between data elements physically stored on a computer-readable storage medium (e.g., persistent storage device). The data structure may specifically include a set of data, a relationship between the data, a function which may be applied to the data, or instructions. Through an effectively designed data structure, a computing device can perform operations while using the resources of the computing device to a minimum. Specifically, the computing device can increase the efficiency of operation, read, insert, delete, compare, exchange, and search through the effectively designed data structure.

The data structure may be divided into a linear data structure and a non-linear data structure according to the type of data structure. The linear data structure may be a structure in which only one data is connected after one data. The linear data structure may include a list, a stack, a queue, and a deque. The list may mean a series of data sets in which an order exists internally. The list may include a linked list. The linked list may be a data structure in which data is connected in a scheme in which each data is linked in a row with a pointer. In the linked list, the pointer may include link information with next or previous data. The linked list may be represented as a single linked list, a double linked list, or a circular linked list depending on the type. The stack may be a data listing structure with limited access to data. The stack may be a linear data structure that may process (e.g., insert or delete) data at only one end of the data structure. The data stored in the stack may be a data structure (LIFO-Last in First Out) in which the data is input last and output first. The queue is a data listing structure that may access data limitedly and unlike a stack, the queue may be a data structure (FIFO-First in First Out) in which late stored data is output late. The deque may be a data structure capable of processing data at both ends of the data structure.

The non-linear data structure may be a structure in which a plurality of data are connected after one data. The non-linear data structure may include a graph data structure. The graph data structure may be defined as a vertex and an edge, and the edge may include a line connecting two different vertices. The graph data structure may include a tree data structure. The tree data structure may be a data structure in which there is one path connecting two different vertices among a plurality of vertices included in the tree. That is, the tree data structure may be a data structure that does not form a loop in the graph data structure.

The data structure may include the neural network. In addition, the data structures, including the neural network, may be stored in a computer readable medium. The data structure including the neural network may also include data preprocessed for processing by the neural network, data input to the neural network, weights of the neural network, hyper parameters of the neural network, data obtained from the neural network, an active function associated with each node or layer of the neural network, and a loss function for learning the neural network. The data structure including the neural network may include predetermined components of the components disclosed above. In other words, the data structure including the neural network may include all of data preprocessed for processing by the neural network, data input to the neural network, weights of the neural network, hyper parameters of the neural network, data obtained from the neural network, an active function associated with each node or layer of the neural network, and a loss function for learning the neural network or a combination thereof. In addition to the above-described configurations, the data structure including the neural network may include predetermined other information that determines the characteristics of the neural network. In addition, the data structure may include all types of data used or generated in the calculation process of the neural network, and is not limited to the above. The computer readable medium may include a computer readable recording medium and/or a computer readable transmission medium. The neural network may be generally constituted by an aggregate of calculation units which are mutually connected to each other, which may be called nodes. The nodes may also be called neurons. The neural network is configured to include one or more nodes.

The data structure may include data input into the neural network. The data structure including the data input into the neural network may be stored in the computer readable medium. The data input to the neural network may include learning data input in a neural network learning process and/or input data input to a neural network in which learning is completed. The data input to the neural network may include preprocessed data and/or data to be preprocessed. The preprocessing may include a data processing process for inputting data into the neural network. Therefore, the data structure may include data to be preprocessed and data generated by preprocessing. The data structure is just an example and the present disclosure is not limited thereto.

The data structure may include the weight of the neural network (in the present disclosure, the weight and the parameter may be used as the same meaning). In addition, the data structures, including the weight of the neural network, may be stored in the computer readable medium. The neural network may include a plurality of weights. The weight may be variable and the weight is variable by a user or an algorithm in order for the neural network to perform a desired function. For example, when one or more input nodes are mutually connected to one output node by the respective links, the output node may determine a data value output from an output node based on values input in the input nodes connected with the output node and the weights set in the links corresponding to the respective input nodes. The data structure is just an example and the present disclosure is not limited thereto.

As a non-limiting example, the weight may include a weight which varies in the neural network learning process and/or a weight in which neural network learning is completed. The weight which varies in the neural network learning process may include a weight at a time when a learning cycle starts and/or a weight that varies during the learning cycle. The weight in which the neural network learning is completed may include a weight in which the learning cycle is completed. Accordingly, the data structure including the weight of the neural network may include a data structure including the weight which varies in the neural network learning process and/or the weight in which neural network learning is completed. Accordingly, the above-described weight and/or a combination of each weight are included in a data structure including a weight of a neural network. The data structure is just an example and the present disclosure is not limited thereto.

The data structure including the weight of the neural network may be stored in the computer-readable storage medium (e.g., memory, hard disk) after a serialization process. Serialization may be a process of storing data structures on the same or different computing devices and later reconfiguring the data structure and converting the data structure to a form that may be used. The computing device may serialize the data structure to send and receive data over the network. The data structure including the weight of the serialized neural network may be reconfigured in the same computing device or another computing device through deserialization. The data structure including the weight of the neural network is not limited to the serialization. Furthermore, the data structure including the weight of the neural network may include a data structure (for example, B-Tree, Trie, m-way search tree, AVL tree, and Red-Black Tree in a nonlinear data structure) to increase the efficiency of operation while using resources of the computing device to a minimum. The above-described matter is just an example and the present disclosure is not limited thereto.

The data structure may include hyper-parameters of the neural network. In addition, the data structures, including the hyper-parameters of the neural network, may be stored in the computer readable medium. The hyper-parameter may be a variable which may be varied by the user. The hyper-parameter may include, for example, a learning rate, a cost function, the number of learning cycle iterations, weight initialization (for example, setting a range of weight values to be subjected to weight initialization), and Hidden Unit number (e.g., the number of hidden layers and the number of nodes in the hidden layer). The data structure is just an example and the present disclosure is not limited thereto.

Figure 21:
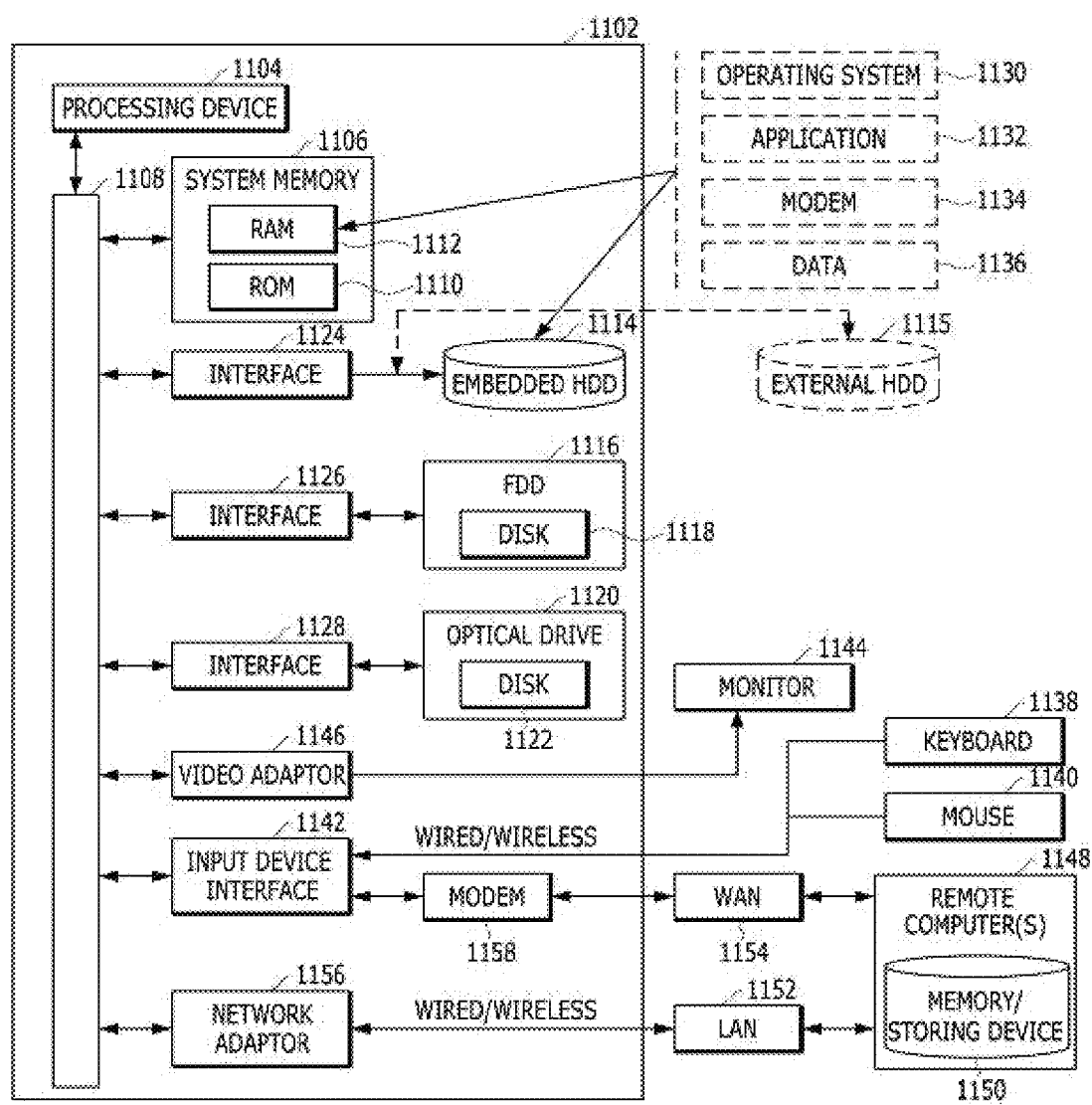
FIG. 21 is a conceptual view of a computing environment according to an exemplary embodiment of the present disclosure.

FIG. 21 is a normal and schematic view of an exemplary computing environment in which the exemplary embodiments of the present disclosure may be implemented.

It is described above that the present disclosure may be generally implemented by the computing device, but those skilled in the art will well know that the present disclosure may be implemented in association with a computer executable command which may be executed on one or more computers and/or in combination with other program modules and/or a combination of hardware and software.

In general, the program module includes a routine, a program, a component, a data structure, and the like that execute a specific task or implement a specific abstract data type. Further, it will be well appreciated by those skilled in the art that the method of the present disclosure can be implemented by other computer system configurations including a personal computer, a handheld computing device, microprocessor-based or programmable home appliances, and others (the respective devices may operate in connection with one or more associated devices as well as a single-processor or multi-processor computer system, a mini computer, and a main frame computer.

The exemplary embodiments described in the present disclosure may also be implemented in a distributed computing environment in which predetermined tasks are performed by remote processing devices connected through a communication network. In the distributed computing environment, the program module may be positioned in both local and remote memory storage devices.

The computer generally includes various computer readable media. Media accessible by the computer may be computer readable media regardless of types thereof and the computer readable media include volatile and non-volatile media, transitory and non-transitory media, and mobile and non-mobile media. As a non-limiting example, the computer readable media may include both computer readable storage media and computer readable transmission media. The computer readable storage media include volatile and non-volatile media, transitory and non-transitory media, and mobile and non-mobile media implemented by a predetermined method or technology for storing information such as a computer readable instruction, a data structure, a program module, or other data. The computer readable storage media include a RAM, a ROM, an EEPROM, a flash memory or other memory technologies, a CD-ROM, a digital video disk (DVD) or other optical disk storage devices, a magnetic cassette, a magnetic tape, a magnetic disk storage device or other magnetic storage devices or predetermined other media which may be accessed by the computer or may be used to store desired information, but are not limited thereto.

The computer readable transmission media generally implement the computer readable command, the data structure, the program module, or other data in a carrier wave or a modulated data signal such as other transport mechanism and include all information transfer media. The term "modulated data signal" means a signal acquired by setting or changing at least one of characteristics of the signal so as to encode information in the signal. As a non-limiting example, the computer readable transmission media include wired media such as a wired network or a direct-wired connection and wireless media such as acoustic, RF, infrared and other wireless media. A combination of any media among the aforementioned media is also included in a range of the computer readable transmission media.

An exemplary environment 1100 that implements various aspects of the present disclosure including a computer 1102 is shown and the computer 1102 includes a processing device 1104, a system memory 1106, and a system bus 1108. The system bus 1108 connects system components including the system memory 1106 (not limited thereto) to the processing device 1104. The processing device 1104 may be a predetermined processor among various commercial processors. A dual processor and other multi-processor architectures may also be used as the processing device 1104.

The system bus 1108 may be any one of several types of bus structures which may be additionally interconnected to a local bus using any one of a memory bus, a peripheral device bus, and various commercial bus architectures. The system memory 1106 includes a read only memory (ROM) 1110 and a random access memory (RAM) 1112. A basic input/output system (BIOS) is stored in the non-volatile memories 1110 including the ROM, the EPROM, the EEPROM, and the like and the BIOS includes a basic routine that assists in transmitting information among components in the computer 1102 at a time such as in-starting. The RAM 1112 may also include a high-speed RAM including a static RAM for caching data, and the like.

The computer 1102 also includes an interior hard disk drive (HDD) 1114 (for example, EIDE and SATA), in which the interior hard disk drive 1114 may also be configured for an exterior purpose in an appropriate chassis (not illustrated), a magnetic floppy disk drive (FDD) 1116 (for example, for reading from or writing in a mobile diskette 1118), and an optical disk drive 1120 (for example, for reading a CD-ROM disk 1122 or reading from or writing in other high-capacity optical media such as the DVD, and the like). The hard disk drive 1114, the magnetic disk drive 1116, and the optical disk drive 1120 may be connected to the system bus 1108 by a hard disk drive interface 1124, a magnetic disk drive interface 1126, and an optical drive interface 1128, respectively. An interface 1124 for implementing an exterior drive includes at least one of a universal serial bus (USB) and an IEEE 1394 interface technology or both of them.

The drives and the computer readable media associated therewith provide non-volatile storage of the data, the data structure, the computer executable instruction, and others. In the case of the computer 1102, the drives and the media correspond to storing of predetermined data in an appropriate digital format. In the description of the computer readable media, the mobile optical media such as the HDD, the mobile magnetic disk, and the CD or the DVD are mentioned, but it will be well appreciated by those skilled in the art that other types of media readable by the computer such as a zip drive, a magnetic cassette, a flash memory card, a cartridge, and others may also be used in an exemplary operating environment and further, the predetermined media may include computer executable commands for executing the methods of the present disclosure.

Multiple program modules including an operating system 1130, one or more application programs 1132, other program module 1134, and program data 1136 may be stored in the drive and the RAM 1112. All or some of the operating system, the application, the module, and/or the data may also be cached in the RAM 1112. It will be well appreciated that the present disclosure may be implemented in operating systems which are commercially usable or a combination of the operating systems.

A user may input instructions and information in the computer 1102 through one or more wired/wireless input devices, for example, pointing devices such as a keyboard 1138 and a mouse 1140. Other input devices (not illustrated) may include a microphone, an IR remote controller, a joystick, a game pad, a stylus pen, a touch screen, and others. These and other input devices are often connected to the processing device 1104 through an input device interface 1142 connected to the system bus 1108, but may be connected by other interfaces including a parallel port, an IEEE 1394 serial port, a game port, a USB port, an IR interface, and others.

A monitor 1144 or other types of display devices are also connected to the system bus 1108 through interfaces such as a video adapter 1146, and the like. In addition to the monitor 1144, the computer generally includes other peripheral output devices (not illustrated) such as a speaker, a printer, others.

The computer 1102 may operate in a networked environment by using a logical connection to one or more remote computers including remote computer(s) 1148 through wired and/or wireless communication. The remote computer(s) 1148 may be a workstation, a computing device computer, a router, a personal computer, a portable computer, a microprocessor based entertainment apparatus, a peer device, or other general network nodes and generally includes multiple components or all of the components described with respect to the computer 1102, but only a memory storage device 1150 is illustrated for brief description. The illustrated logical connection includes a wired/wireless connection to a local area network (LAN) 1152 and/or a larger network, for example, a wide area network (WAN) 1154. The LAN and WAN networking environments are general environments in offices and companies and facilitate an enterprise-wide computer network such as Intranet, and all of them may be connected to a worldwide computer network, for example, the Internet.

When the computer 1102 is used in the LAN networking environment, the computer 1102 is connected to a local network 1152 through a wired and/or wireless communication network interface or an adapter 1156. The adapter 1156 may facilitate the wired or wireless communication to the LAN 1152 and the LAN 1152 also includes a wireless access point installed therein in order to communicate with the wireless adapter 1156. When the computer 1102 is used in the WAN networking environment, the computer 1102 may include a modem 1158 or has other means that configure communication through the WAN 1154 such as connection to a communication computing device on the WAN 1154 or connection through the Internet. The modem 1158 which may be an internal or external and wired or wireless device is connected to the system bus 1108 through the serial port interface 1142. In the networked environment, the program modules described with respect to the computer 1102 or some thereof may be stored in the remote memory/storage device 1150. It will be well known that an illustrated network connection is exemplary and other means configuring a communication link among computers may be used.

The computer 1102 performs an operation of communicating with predetermined wireless devices or entities which are disposed and operated by the wireless communication, for example, the printer, a scanner, a desktop and/or a portable computer, a portable data assistant (PDA), a communication satellite, predetermined equipment or place associated with a wireless detectable tag, and a telephone. This at least includes wireless fidelity (Wi-Fi) and Bluetooth wireless technology. Accordingly, communication may be a predefined structure like the network in the related art or just ad hoc communication between at least two devices.

The wireless fidelity (Wi-Fi) enables connection to the Internet, and the like without a wired cable. The Wi-Fi is a wireless technology such as the device, for example, a cellular phone which enables the computer to transmit and receive data indoors or outdoors, that is, anywhere in a communication range of a base station. The Wi-Fi network uses a wireless technology called IEEE 802.11(a, b, g, and others) in order to provide safe, reliable, and high-speed wireless connection. The Wi-Fi may be used to connect the computers to each other or the Internet and the wired network (using IEEE 802.3 or Ethernet). The Wi-Fi network may operate, for example, at a data rate of 11 Mbps (802.11a) or 54 Mbps (802.11b) in unlicensed 2.4 and 5 GHz wireless bands or operate in a product including both bands (dual bands).

It will be appreciated by those skilled in the art that information and signals may be expressed by using various different predetermined technologies and techniques. For example, data, instructions, commands, information, signals, bits, symbols, and chips which may be referred in the above description may be expressed by voltages, currents, electromagnetic waves, magnetic fields or particles, optical fields or particles, or predetermined combinations thereof.

It may be appreciated by those skilled in the art that various exemplary logical blocks, modules, processors, means, circuits, and algorithm steps described in association with the exemplary embodiments disclosed herein may be implemented by electronic hardware, various types of programs or design codes (for easy description, herein, designated as software), or a combination of all of them. In order to clearly describe the intercompatibility of the hardware and the software, various exemplary components, blocks, modules, circuits, and steps have been generally described above in association with functions thereof. Whether the functions are implemented as the hardware or software depends on design restrictions given to a specific application and an entire system. Those skilled in the art of the present disclosure may implement functions described by various methods with respect to each specific application, but it should not be interpreted that the implementation determination departs from the scope of the present disclosure.

Various exemplary embodiments presented herein may be implemented as manufactured articles using a method, a device, or a standard programming and/or engineering technique. The term manufactured article includes a computer program, a carrier, or a medium which is accessible by a predetermined computer-readable storage device. For example, a computer-readable storage medium includes a magnetic storage device (for example, a hard disk, a floppy disk, a magnetic strip, or the like), an optical disk (for example, a CD, a DVD, or the like), a smart card, and a flash memory device (for example, an EEPROM, a card, a stick, a key drive, or the like), but is not limited thereto. Further, various storage media presented herein include one or more devices and/or other machine-readable media for storing information.

It will be appreciated that a specific order or a hierarchical structure of steps in the presented processes is one example of exemplary accesses. It will be appreciated that the specific order or the hierarchical structure of the steps in the processes within the scope of the present disclosure may be rearranged based on design priorities. Appended method claims provide elements of various steps in a sample order, but the method claims are not limited to the presented specific order or hierarchical structure.

The description of the presented exemplary embodiments is provided so that those skilled in the art of the present disclosure use or implement the present disclosure. Various modifications of the exemplary embodiments will be apparent to those skilled in the art and general principles defined herein can be applied to other exemplary embodiments without departing from the scope of the present disclosure. Therefore, the present disclosure is not limited to the exemplary embodiments presented herein, but should be interpreted within the widest range which is coherent with the principles and new features presented herein.

What is claimed is:

1. A method for automating a semiconductor design based on artificial intelligence, the method performed by a computing device including at least one processor, the method comprising:
    generating a first mask to be placed in a canvas;
    generating a first embedding for a semiconductor element to be placed in the canvas in an area where the first mask is not placed and based on feature information and logical design information of the semiconductor element by using a first neural network; and
    generating a probability distribution for placing the semiconductor element based on the first embedding and a second embedding for semiconductor elements already placed in the canvas by using a second neural network,
    wherein the first neural network and the second neural network are pre-trained through a reward,
    wherein the reward is computed by a weighted sum of a length of a wire connecting the semiconductor elements placed in the canvas, and a congestion of the semiconductor elements placed in the canvas, and
    wherein the congestion of the semiconductor elements are maximally evenly distributed.

2. The method of claim 1, wherein the feature information includes:
    size information including at least one of a width or a height of the semiconductor element,
    type information indicating whether the semiconductor element is a macro cell, and
    numerical information indicating the number of other elements connected to the semiconductor element.

3. The method of claim 1, wherein the logical design information includes:
    index information regarding a placement order of the semiconductor element, and netlist information indicating a connection of semiconductor elements.

4. The method of claim 3, further comprising:
    converting the netlist information into an ordinary graph structure expressing the connection of the semiconductor elements one to one.

5. The method of claim 1, wherein the first neural network includes a graph neural network using a residual connection.

6. The method of claim 1, wherein the generating of the probability distribution for placing the semiconductor element based on the first embedding and the second embedding for semiconductor elements already placed in the canvas includes:
    combining the first embedding and the second embedding in a space based on a grid of the canvas by using the second neural network, and
    generating the probability distribution for placing the semiconductor element by adjusting a dimension of a third embedding generated by the combination through the second neural network.

7. The method of claim 6, wherein the combining of the first embedding and the second embedding in the space based on the grid of the canvas includes:
    generating a placement map representing the placement state of the semiconductor elements already placed in the canvas by using the second neural network, and generating the third embedding by broadcasting the first embedding to the placement map through the second neural network.

8. The method of claim 7, wherein the generating of the placement map representing the placement state of the semiconductor elements already placed in the canvas includes:
generating the placement map by aggregating the second embedding to all areas of the grid through the second neural network.

9. The method of claim 7, wherein the generating of the third embedding by broadcasting the first embedding to the placement map includes:
generating the third embedding by concatenating the first embedding to all second embeddings included in the placement map through the second neural network.

10. The method of claim 6, wherein the generating of the probability distribution for placing the semiconductor element by adjusting the dimension of the third embedding generated by the combination includes:
generating the probability distribution for placing the semiconductor element by gradually reducing the dimension of the third embedding generated by the combination through the second neural network.

11. The method of claim 1, wherein the first neural network and the second neural network are pre-trained through a reinforcement learning based on a state including the feature information and the logical design information of the semiconductor element, an action of placing the semiconductor element in the canvas in an order by a larger size, and a reward for the action.

12. The method of claim 1, wherein the congestion is computed as a ratio of a second routing resource indicating a required resource for connecting the semiconductor elements placed in the canvas by the wire to a first routing resource indicating a supplied resource in which the wire may be assigned for each area of the canvas.

13. A computer program stored in a non-transitory computer-readable storage medium, wherein the computer program executes the following operations for automating a semiconductor design based on artificial intelligence when the computer program is executed by one or more processors, the operations comprising:
an operation of generating a first mask to be placed in a canvas;
an operation of generating a first embedding for a semiconductor element to be placed in the canvas in an area where the first mask is not placed and based on feature information and logical design information of the semiconductor element by using a first neural network; and
an operation of generating a probability distribution for placing the semiconductor element based on the first embedding and a second embedding for semiconductor elements already placed in the canvas by using a second neural network,
wherein the first neural network and the second neural network are pre-trained through a reward,
wherein the reward is computed by a weighted sum of a length of a wire connecting the semiconductor elements placed in the canvas, and a congestion of the semiconductor elements placed in the canvas, and
wherein the congestion of the semiconductor elements are maximally evenly distributed.

14. A computing device for automating a semiconductor design based on artificial intelligence, the device comprising:
a processor including at least one core;
a memory including program codes executable in the processor; and
a network unit receiving feature information and logical design information of a semiconductor element,
wherein the processor is configured to:
generate a first mask to be placed in a canvas;
generate a first embedding for a semiconductor element to be placed in the canvas in an area where the first mask is not placed and based on the feature information and the logical design information by using a first neural network, and
generate a probability distribution for placing the semiconductor element based on the first embedding and a second embedding for semiconductor elements already placed in the canvas by using a second neural network, and
wherein the first neural network and the second neural network are pre-trained through a reward, and
wherein the reward is computed by a weighted sum of a length of a wire connecting the semiconductor elements placed in the canvas, and a congestion of the semiconductor elements placed in the canvas, and
wherein the congestion of the semiconductor elements are maximally evenly distributed.

* * * * *